US011562707B2

(12) United States Patent
Katsuta et al.

(10) Patent No.: US 11,562,707 B2
(45) Date of Patent: Jan. 24, 2023

(54) LIQUID CRYSTAL DISPLAY DEVICE CONFIGURED FOR SPEEDING UP GATE DRIVE OF PIXEL TRANSISTORS

(71) Applicant: Japan Display Inc., Tokyo (JP)

(72) Inventors: Tadayoshi Katsuta, Tokyo (JP); Yoshikazu Hashiba, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/479,090

(22) Filed: Sep. 20, 2021

(65) Prior Publication Data

US 2022/0005432 A1 Jan. 6, 2022

Related U.S. Application Data

(63) Continuation of application No. PCT/JP2019/050963, filed on Dec. 25, 2019.

(30) Foreign Application Priority Data

Mar. 26, 2019 (JP) .............................. JP2019-059434

(51) Int. Cl.
G09G 3/36 (2006.01)
G06F 3/041 (2006.01)
(Continued)

(52) U.S. Cl.
CPC ........... *G09G 3/3677* (2013.01); *G06F 3/044* (2013.01); *G06F 3/0412* (2013.01);
(Continued)

(58) Field of Classification Search
CPC ...... G09G 3/36; G09G 3/3611; G09G 3/3614; G09G 3/364; G09G 3/3648; G09G 3/3674;
(Continued)

(56) References Cited

U.S. PATENT DOCUMENTS

2001/0033266 A1* 10/2001 Lee ...................... G09G 3/3696
345/94
2004/0051688 A1* 3/2004 Orii ..................... G09G 3/3677
345/87
(Continued)

FOREIGN PATENT DOCUMENTS

JP 2007174001 A 7/2007
JP 2007323041 A 12/2007
(Continued)

OTHER PUBLICATIONS

International Search Report in Application No. PCT/JP2019/050963, dated Mar. 17, 2020.
(Continued)

*Primary Examiner* — Alexander Eisen
*Assistant Examiner* — Nelson Lam
(74) *Attorney, Agent, or Firm* — K&L Gates LLP

(57) ABSTRACT

The display control circuit includes a drive signal generation circuit that generates a gate drive signal, a scanning line drive circuit that supplies the gate drive signal to the scanning line, and a first wire through which the gate drive signal from the drive signal generation circuit is supplied to the scanning line drive circuit. The drive signal generation circuit includes a first potential supply circuit that supplies, to the first wire, a first potential equal to or lower than an off-potential of the pixel transistor, a second potential supply circuit that supplies, to the first wire, a second potential lower than the first potential, a third potential supply circuit that supplies, to the first wire, a third potential higher than the first potential, and a fourth potential supply circuit that supplies, to the first wire, a fourth potential equal to or higher than an on-potential of the pixel transistor.

16 Claims, 24 Drawing Sheets

(51) Int. Cl.
    *G06F 3/044* (2006.01)
    *G11C 19/28* (2006.01)
(52) U.S. Cl.
    CPC . *G06F 3/04166* (2019.05); *G09G 2310/0202* (2013.01); *G09G 2310/0243* (2013.01); *G09G 2310/0286* (2013.01); *G09G 2310/08* (2013.01); *G09G 2330/02* (2013.01); *G11C 19/28* (2013.01)
(58) Field of Classification Search
    CPC .. G09G 3/3677; G09G 3/3681; G09G 3/3696; G09G 2310/0202; G09G 2310/0243; G09G 2310/0286; G09G 2310/0289; G09G 2330/02
    USPC .................................................. 345/87–104
    See application file for complete search history.

(56) References Cited

U.S. PATENT DOCUMENTS

| | | | |
|---|---|---|---|
| 2006/0001640 A1* | 1/2006 | Lee | G09G 3/3677 345/100 |
| 2006/0145991 A1* | 7/2006 | Jang | G09G 3/3677 345/94 |
| 2007/0139351 A1 | 6/2007 | Hashimoto | |
| 2007/0279360 A1 | 12/2007 | Park et al. | |
| 2010/0033417 A1* | 2/2010 | Shu | G09G 3/3677 345/98 |
| 2010/0156928 A1* | 6/2010 | Lee | G09G 3/3655 345/589 |
| 2011/0012932 A1* | 1/2011 | Morimoto | G09G 3/20 345/690 |
| 2011/0019118 A1* | 1/2011 | Maki | G02F 1/13306 349/48 |
| 2013/0314392 A1 | 11/2013 | Kim | |
| 2014/0015868 A1* | 1/2014 | Yamazaki | G09G 3/3614 345/87 |
| 2016/0133212 A1* | 5/2016 | Jung | G09G 3/3688 345/99 |
| 2018/0268767 A1 | 9/2018 | Pyun et al. | |
| 2020/0234670 A1* | 7/2020 | Horibe | G09G 3/3688 |

FOREIGN PATENT DOCUMENTS

| | | |
|---|---|---|
| JP | 2013246431 A | 12/2013 |
| JP | 2014-228575 | 12/2014 |
| WO | 2013002189 A1 | 1/2013 |
| WO | 2018142546 A1 | 8/2018 |

OTHER PUBLICATIONS

Japanese Office Action dated Sep. 20, 2022 in corresponding Japanese Application No. 2019-059434.

* cited by examiner

LIQUID CRYSTAL DISPLAY DEVICE CONFIGURED FOR SPEEDING UP GATE DRIVE OF PIXEL TRANSISTORS

CROSS-REFERENCE TO RELATED APPLICATION

This application claims the benefit of priority from Japanese Patent Application No. 2019-059434 filed on Mar. 26, 2019 and International Patent Application No. PCT/JP2019/050963 filed on Dec. 25, 2019, the entire contents of which are incorporated herein by reference.

BACKGROUND

1. Technical Field

The present disclosure relates to a display device and a semiconductor device.

2. Description of the Related Art

Recently, size increase and high definition have been desired for a flat panel display such as a liquid crystal display, an OLED, or an electrophoretic display (EPD). For example, a technology (for example, Japanese Patent Application Laid-open Publication No. 2014-228575) has been disclosed that reduces display unevenness on a display screen in an extension direction of scanning lines due to generation of variance in writing times of gradation voltage applied to TFT elements when the screen size and definition of the display panel are increased.

Each pixel transistor provided in a display region is coupled to a gate line for supplying a scanning signal and a signal line for supplying a pixel signal. The gate line is coupled to the gates of a large number of pixel transistors, and thus a parasitic capacitance is generated on the gate line and time constants of this system can become large in view of a pixel transistor at a position away from a scanning line drive circuit, in particular. With a configuration in which the gate line is long due to increase in the screen size and the gate line is coupled to a large number of pixel transistors due to increase in the definition, in particular, time is needed to write a scanning signal to a pixel transistor at a position away from the scanning line drive circuit, and writing to all pixel transistors potentially cannot be completed in one horizontal period.

The present disclosure is intended to provide a display device and a semiconductor device that can speed up gate drive of pixel transistors.

SUMMARY

According to one aspect of the present disclosure, there is provided a display device comprising: a display region in which multiple pixels each of which includes a pixel capacitor and a pixel transistor are arranged in a matrix of a row-column configuration in a first direction and a second direction intersecting the first direction; multiple scanning lines electrically coupled to the multiple pixels arranged in the first direction; multiple signal lines electrically coupled to the multiple pixels arranged in the second direction; and a display control circuit provided in a non-display region enclosing the display region and configured to control the pixel transistor to be on and off through the scanning lines, wherein the pixel transistor is an N-type transistor, has a gate coupled to the scanning line, has a source coupled to the signal line, and has a drain coupled to the pixel capacitor, the display control circuit includes a drive signal generation circuit configured to generate a gate drive signal that controls the pixel transistor to be on and off, a scanning line drive circuit configured to supply the gate drive signal to the scanning line, and a first wire through which the gate drive signal from the drive signal generation circuit is supplied to the scanning line drive circuit, and the drive signal generation circuit includes a first potential supply circuit configured to supply, to the first wire, a first potential equal to or lower than an off-potential of the pixel transistor, a second potential supply circuit configured to supply, to the first wire, a second potential lower than the first potential, a third potential supply circuit configured to supply, to the first wire, a third potential higher than the first potential, and a fourth potential supply circuit configured to supply, to the first wire, a fourth potential higher than the third potential and equal to or higher than an on-potential of the pixel transistor.

DETAILED DESCRIPTION

Aspects (embodiments) of the present disclosure will be described below in detail with reference to the accompanying drawings. The present disclosure is not limited by contents described below in the embodiments. Components described below include those that could be easily thought of by the skilled person in the art and those identical in effect. Components described below may be combined as appropriate. What is disclosed herein is merely exemplary, and the scope of the present disclosure includes any modification that could be easily thought of by the skilled person in the art as appropriate without departing from the scope of the disclosure. For clearer description, the drawings are schematically illustrated for the width, thickness, shape, and the like of each component as compared to actual aspects thereof in some cases, but they are merely exemplary and do not limit interpretation of the present disclosure. In the present specification and the drawings, any element same as that already described with reference to an already described drawing is denoted by the same reference sign, and detailed description thereof is omitted as appropriate.

Figure 1:
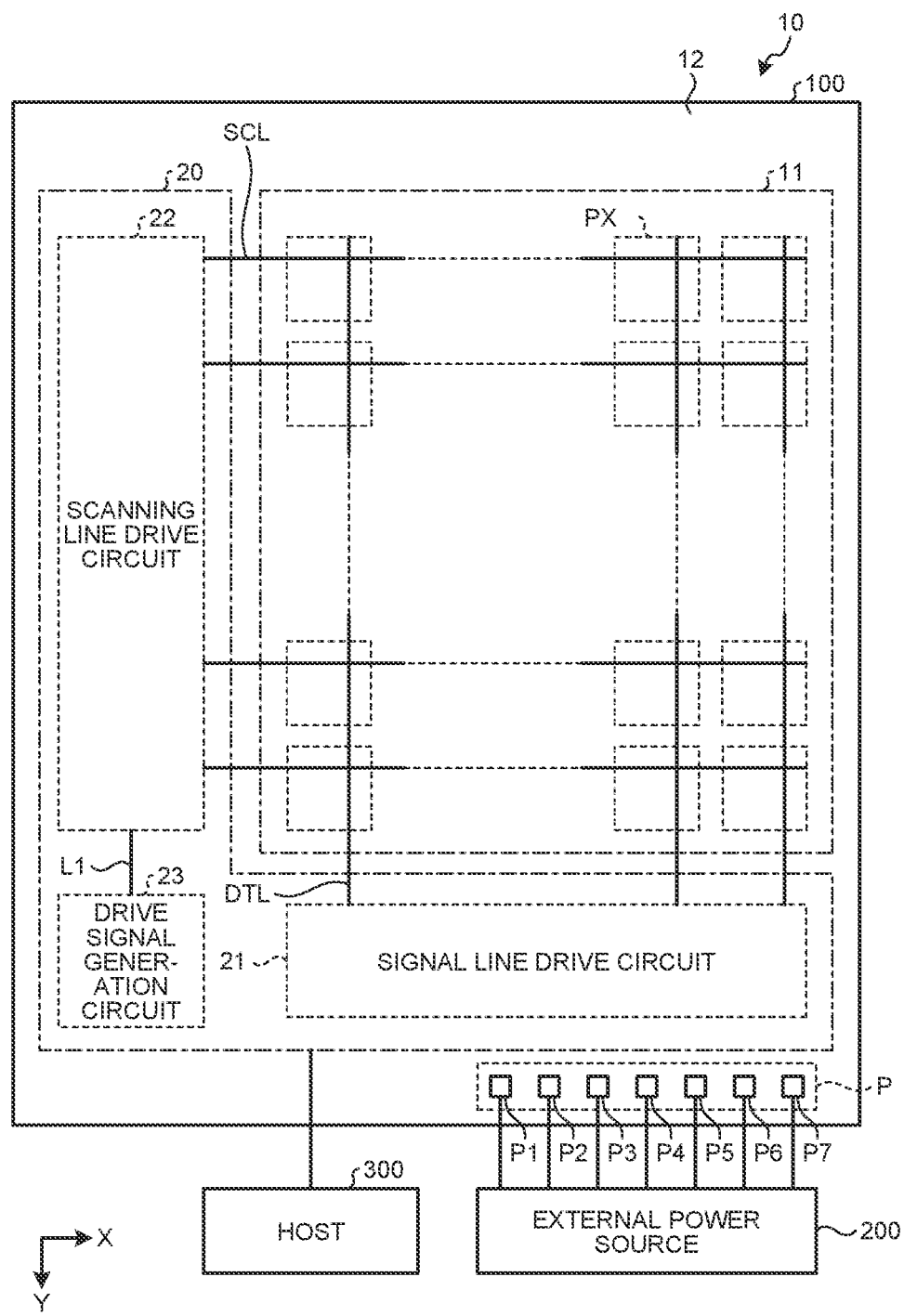
FIG. 1 is a diagram illustrating an example of a schematic configuration of a display device according to an embodiment.

FIG. 1 is a diagram illustrating an example of a schematic configuration of a display device according to an embodiment.

This display device 10 is, for example, a liquid crystal display panel. In the embodiment, the display device 10 is not limited to a liquid crystal display panel. For example, the display device 10 may be an organic EL display including an organic light emitting diode (OLED) as a display element. Alternatively, the display device 10 may be an inorganic EL display including an inorganic light emitting diode (micro LED) as a display element. Alternatively, the display device 10 may be an electrophoretic display (EPD).

The display device 10 may be, for example, a device integrated with a capacitive touch sensor. Incorporation and integration of a capacitive touch sensor in the display device 10 include, for example, a combined use of partial members such as a display substrate and an electrode for the display and partial members such as a substrate and an electrode for the touch sensor. Alternatively, the display device 10 may be, for example, what is called an on-cell device on which a capacitive touch sensor is mounted. The present disclosure is not limited by the aspect of the display device 10.

Various power voltages are applied to the display device 10 according to the embodiment from an external power source 200 (for example, a power circuit of an electronic apparatus on which the display device 10 is mounted). The display device 10 performs image display based on a signal output from a HOST 300 that is, for example, a host processor of the electronic apparatus. In the present embodiment, the display device 10 may perform monochrome display or may perform color display using color filters of multiple colors and the like.

The display device 10 includes a display region 11 and a non-display region 12 enclosing the display region 11. The display device also includes a thin film transistor (TFT) substrate (hereinafter referred to as TFT substrate) 100, a counter substrate 101 provided facing the TFT substrate 100, and a display functional layer provided between the substrate 100 and the substrate 101. In the present embodiment, the display functional layer is configured as a liquid crystal layer 6. In addition, a display control circuit 20 is provided on the non-display region 12 of the TFT substrate 100.

Multiple pixels PX arranged in a two-dimensional matrix of a row-column configuration in a first direction (X direction in FIG. 1) and a second direction (Y direction in FIG. 1) orthogonal to the first direction are provided in the display region 11. Hereinafter, the first direction (X direction in FIG. 1) is also referred to as a row direction, and the second direction (Y direction in FIG. 1) is also referred to as a column direction. In addition, a row on which pixels PX arranged in the row direction is also referred to as a pixel row, and a column on which pixels PX are arranged in the column direction is also referred to as a pixel column.

A terminal unit P for supplying various power sources from the external power source 200 to the display control circuit 20 is provided in the non-display region 12. The terminal unit P includes a first potential terminal P1 for supplying a first potential VGL, a second potential terminal P2 for supplying a second potential VGL2, a third potential terminal P3 for supplying a third potential GND, a fourth potential terminal P4 for supplying a fourth potential VGH2, a fifth potential terminal P5 for supplying a fifth potential VDD (VDD1), a sixth potential terminal P6 for supplying a sixth potential VGH, and a seventh potential terminal P7 for supplying a seventh potential VDD2. Each potential will be described later in detail.

The display control circuit 20 includes a signal line drive circuit 21, a scanning line drive circuit 22, and a drive signal generation circuit 23. The signal line drive circuit 21, the scanning line drive circuit 22, and the drive signal generation circuit 23 operate based on various signals from the HOST 300 (for example, a control circuit of the electronic apparatus on which the display device 10 is mounted).

The signal line drive circuit 21 is configured as, for example, a display IC mounted in the non-display region 12 on the TFT substrate 100.

In the present embodiment, the scanning line drive circuit 22 and the drive signal generation circuit 23 are thin film transistor (TFT) circuits formed in the non-display region 12 on the TFT substrate 100.

The signal line drive circuit 21 is electrically coupled to the pixel columns in the display region 11 through multiple signal lines DTL and transmits a pixel signal SIG to each of the signal lines DTL. The pixel signal SIG is supplied to each of the pixels PX on the corresponding pixel column.

The scanning line drive circuit 22 is electrically coupled to the pixel rows in the display region 11 through multiple scanning lines SCL and transmits a scanning signal GATE to each of the scanning lines SCL. The scanning signal GATE is supplied to each of the pixels PX on the corresponding pixel row.

Figure 2A:
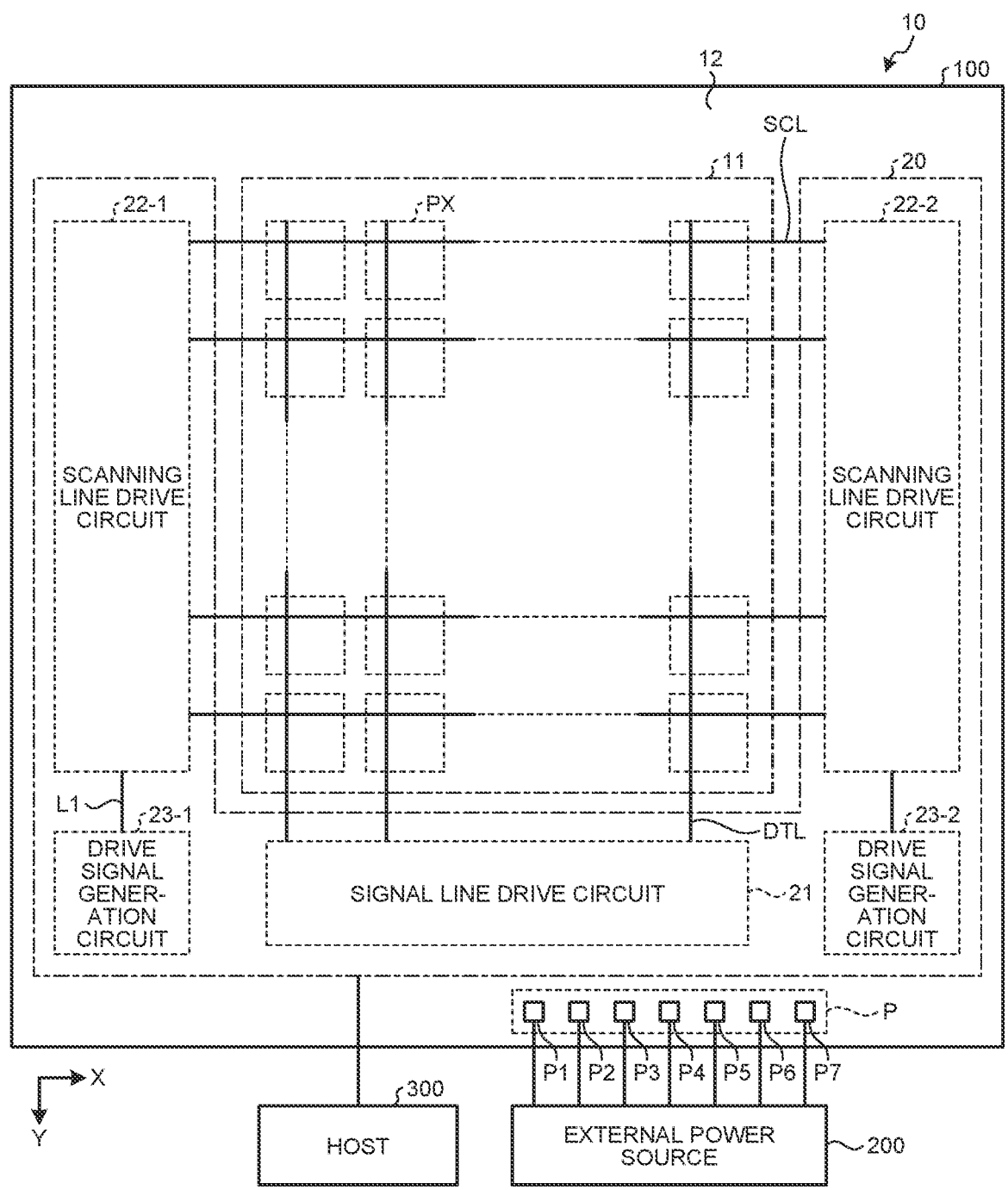
FIG. 2A is a diagram illustrating another example of a schematic configuration of the display device according to the embodiment, which is different from that in FIG. 1.
Figure 2B:
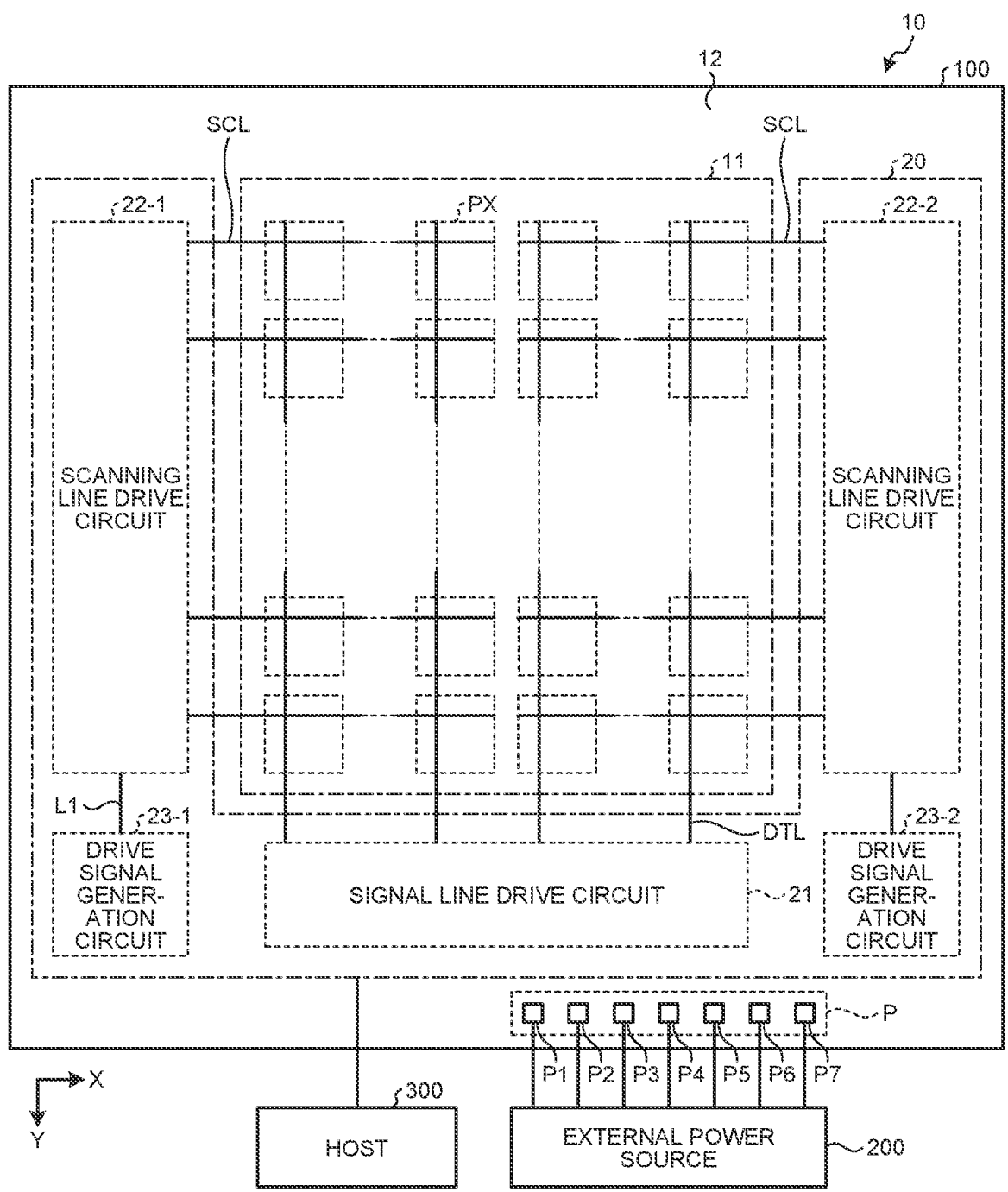
FIG. 2B is a diagram illustrating a second example of a schematic configuration of the display device according to the embodiment, which is different from that in FIG. 1.

FIG. 2A is a diagram illustrating a first example of a schematic configuration of the display device according to the embodiment, which is different from that in FIG. 1. FIG. 2B is a diagram illustrating a second example of a schematic configuration of the display device according to the embodiment, which is different from that in FIG. 1.

Although FIG. 1 illustrates the example in which the scanning line drive circuit 22 is provided in the non-display region 12 on the left side of the display region 11, it is possible to have a configuration in which scanning line drive circuits are provided on the right and left sides of the display region as illustrated in FIGS. 2A and 2B. In FIG. 2A, the scanning lines SCL are coupled to both a scanning line drive circuit 22-1 on the left side and a scanning line drive circuit 22-2 on the right side. In FIG. 2B, the scanning line SCL extending from the scanning line drive circuit 22-1 may be coupled to the scanning lines SCL extending from the scanning line drive circuit 22-2 in the display region 11. Alternatively, the scanning line drive circuit for odd-numbered pixel rows from the top may be provided in the non-display region 12 on the right side of the display region 11, and the scanning line drive circuit for even-numbered pixel rows from the top may be provided in the non-display region 12 on the left side of the display region 11.

Figure 3A:
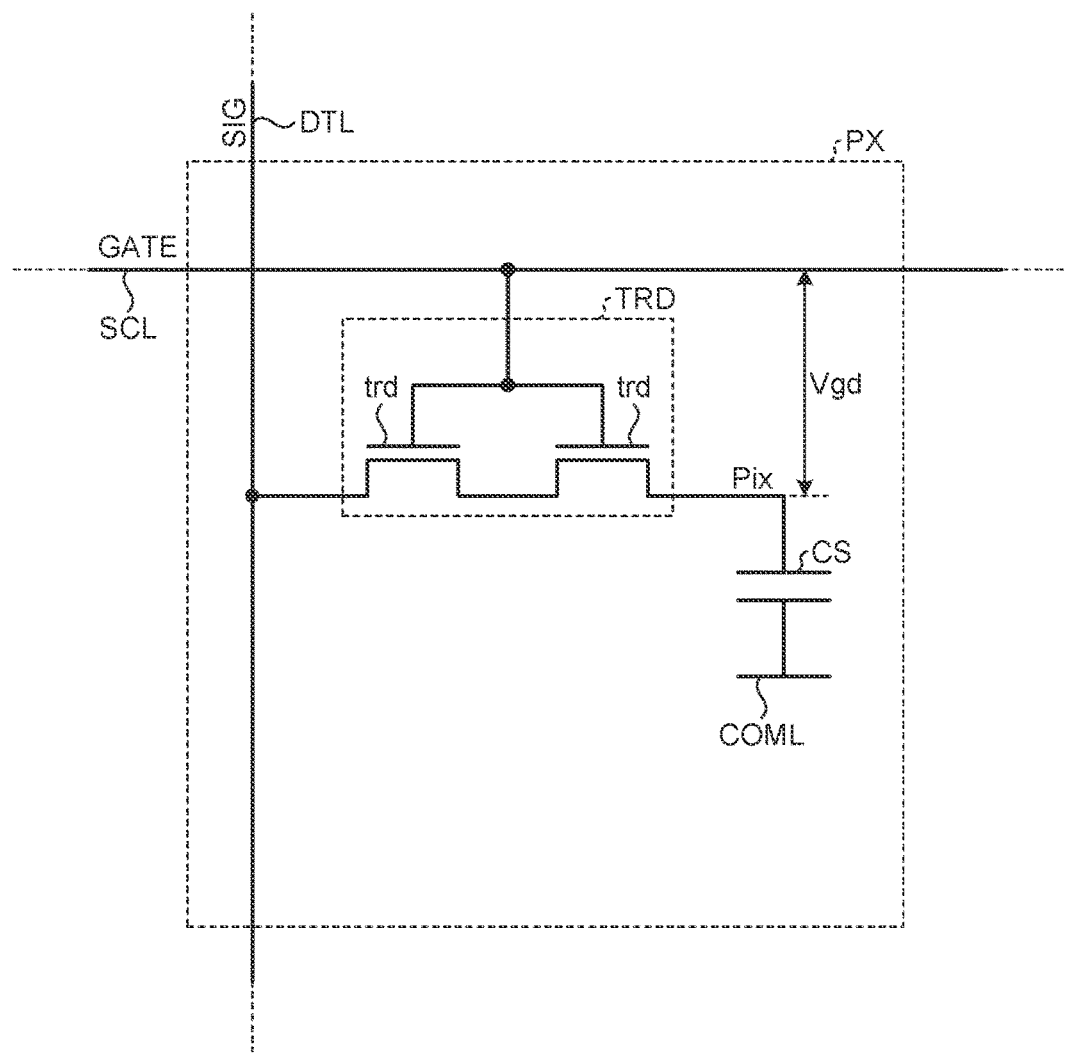
FIG. 3A is a diagram illustrating an example of a configuration of a pixel in the display device according to the embodiment.

FIG. 3A is a diagram illustrating an example of a configuration of a pixel in the display device according to the embodiment. The example in FIG. 3A illustrates a configuration of a pixel PX on the q-th row and the p-th column.

FIG. 3A illustrates an example in which a pixel transistor TRD included in the pixel PX has a double gate structure including two NMOS transistors trd. The configuration of the pixel transistor TRD is not limited thereto, but for example, may include one NMOS transistor. The present disclosure is not limited by the configuration of the pixel transistor TRD.

The scanning signal GATE is supplied to a gate of the pixel transistor TRD through the corresponding scanning line SCL. The scanning signal GATE will be described later. A source of the pixel transistor TRD is coupled to the corresponding signal line DTL.

A pixel electrode Pix is provided at a drain of the pixel transistor TRD. A pixel capacitor (capacitor element) CS is formed between the pixel electrode Pix and a common electrode COML configured to supply common potential VCOM.

The pixel signal SIG is supplied from the signal line drive circuit 21 to the source of the pixel transistor TRD through the signal line DTL. The pixel signal SIG has a voltage upper limit value of VDD1 and a voltage lower limit value of VDD2.

In the present embodiment, VDD1 as the voltage upper limit value of the pixel signal SIG is potential higher than GND potential. In addition, in the present embodiment, VDD2 as the voltage lower limit value of the pixel signal SIG is potential lower than the GND potential. The potential difference between VDD1 and the GND potential is preferably substantially equal to the potential difference between the GND potential and VDD2.

An on-off state of the pixel transistor TRD is controlled by the scanning signal GATE supplied from the scanning line drive circuit 22. The pixel transistor TRD is turned on, and the pixel signal SIG is supplied to the pixel electrode Pix from the signal line. Then, electric charge in accordance with the pixel signal SIG is charged at the pixel electrode Pix. The pixel electrode Pix can have a voltage value between VDD1 and VDD2. Specifically, in the present embodiment, the range of voltage that the pixel electrode Pix can have is a voltage range from VDD2 to VDD1, which is same as that of the pixel signal SIG. A potential difference Vgd generated between the pixel electrode Pix and the scanning line SCL will be described later.

Figure 3B:
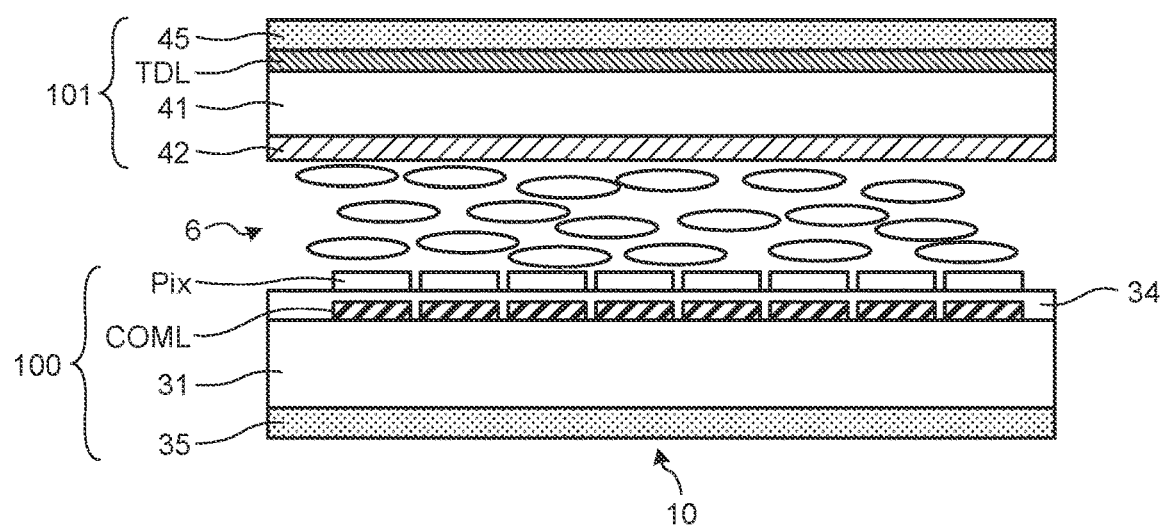
FIG. 3B is a cross-sectional view illustrating a schematic sectional structure of a display region in the display device according to the embodiment.

An exemplary configuration of the display device 10 according to the present embodiment will be described in detail below. FIG. 3B is a cross-sectional view illustrating a schematic sectional structure of the display region in the display device according to the embodiment. The following describes a configuration integrated with a capacitive touch sensor.

As illustrated in FIG. 3B, the display device 10 includes the TFT substrate 100, the counter substrate 101, and the liquid crystal layer 6 as the display functional layer. The counter substrate 101 is disposed facing the TFT substrate 100 in a direction perpendicular to a surface of the TFT substrate 100. The liquid crystal layer 6 is provided between the TFT substrate 100 and the counter substrate 101.

The TFT substrate 100 includes a first substrate 31, the pixel electrodes Pix, the common electrodes COML, and a polarization plate 35. A circuit such as a shift register included in the scanning line drive circuit 22, a switching element such as a thin film transistor (TFT), and various wires (not illustrated in FIG. 3B) such as the scanning lines SCL and the signal lines DTL are provided on the first substrate 31.

The common electrodes COML are provided above the first substrate 31. The pixel electrodes Pix are provided above the common electrode COML through an insulating layer 34. The pixel electrodes Pix are provided in a layer different from that of the common electrode COML and is disposed overlapping the common electrode COML in plan view. The pixel electrodes Pix are disposed in a matrix of a row-column configuration in plan view. The polarization plate 35 is provided below the first substrate 31.

In the present specification, an "upward direction" is defined to be a direction from the first substrate 31 toward a second substrate 41 among directions perpendicular to the surface of the first substrate 31. A "downward direction" is defined to be a direction from the second substrate 41 toward the first substrate 31. "Plan view" is a view in a direction perpendicular to the surface of the first substrate 31.

Each of the pixel electrodes Pix is provided for a sub pixel included in the corresponding pixel PX of the display device 10. The pixel signal SIG for performing display operation is supplied from the signal line drive circuit 21 to the pixel electrode Pix. In the display operation, a display drive signal VCOM that is a direct-current voltage signal is supplied to the common electrode COML. Accordingly, the common electrode COML functions as a common electrode for the multiple pixel electrodes Pix. The common electrode COML also functions as a drive electrode or a detection electrode in capacitive touch detection. When a touch detection is performed by using the common electrode COML, the common electrode COML is preferably divided for multiple electrodes and may be divided in strip shapes or tile shapes in the display region 11. The common electrode COML may be provided on the counter substrate 101.

In the present embodiment, the pixel electrodes Pix and the common electrodes COML are made of, for example, a translucent conductive material such as indium tin oxide (ITO).

The counter substrate 101 includes the second substrate 41, a color filter 42 formed on one surface of the second substrate 41, a detection electrode TDL provided on the other surface of the second substrate 41, and a polarization plate 45. The detection electrode TDL is arrayed on the second substrate 41. The detection electrode TDL functions as a detection electrode in mutual capacitive touch detection and self-capacitive touch detection.

In the present embodiment, the detection electrode TDL is made of, for example, a translucent conductive material such as ITO. Alternatively, the detection electrode TDL may be made of a metal thin line having a pattern of a mesh shape, a zigzag line shape, a wavy line shape, or a straight shape.

The color filter 42 faces the liquid crystal layer 6 in the direction perpendicular to the first substrate 31. The color filter 42 may be disposed on the first substrate 31. In the present embodiment, the first substrate 31 and the second substrate 41 are, for example, a glass substrate or a resin substrate.

The first substrate 31 and the second substrate 41 are disposed facing each other at a predetermined interval. The liquid crystal layer 6 is provided between the first substrate 31 and the second substrate 41. The liquid crystal layer 6 modulates passing light in accordance with a state of electric field between the pixel electrodes and the common electrode.

An illumination unit (backlight; not illustrated) is provided below the first substrate 31. The illumination unit includes a light source such as an LED and emits light from the light source toward the first substrate 31. The light from the illumination unit passes through the TFT substrate 100 and is modulated in accordance with the state of liquid crystal at a passing position, and thus its state of transmission to a display surface changes with position. Accordingly, an image is displayed in the display region 11.

Figure 4:
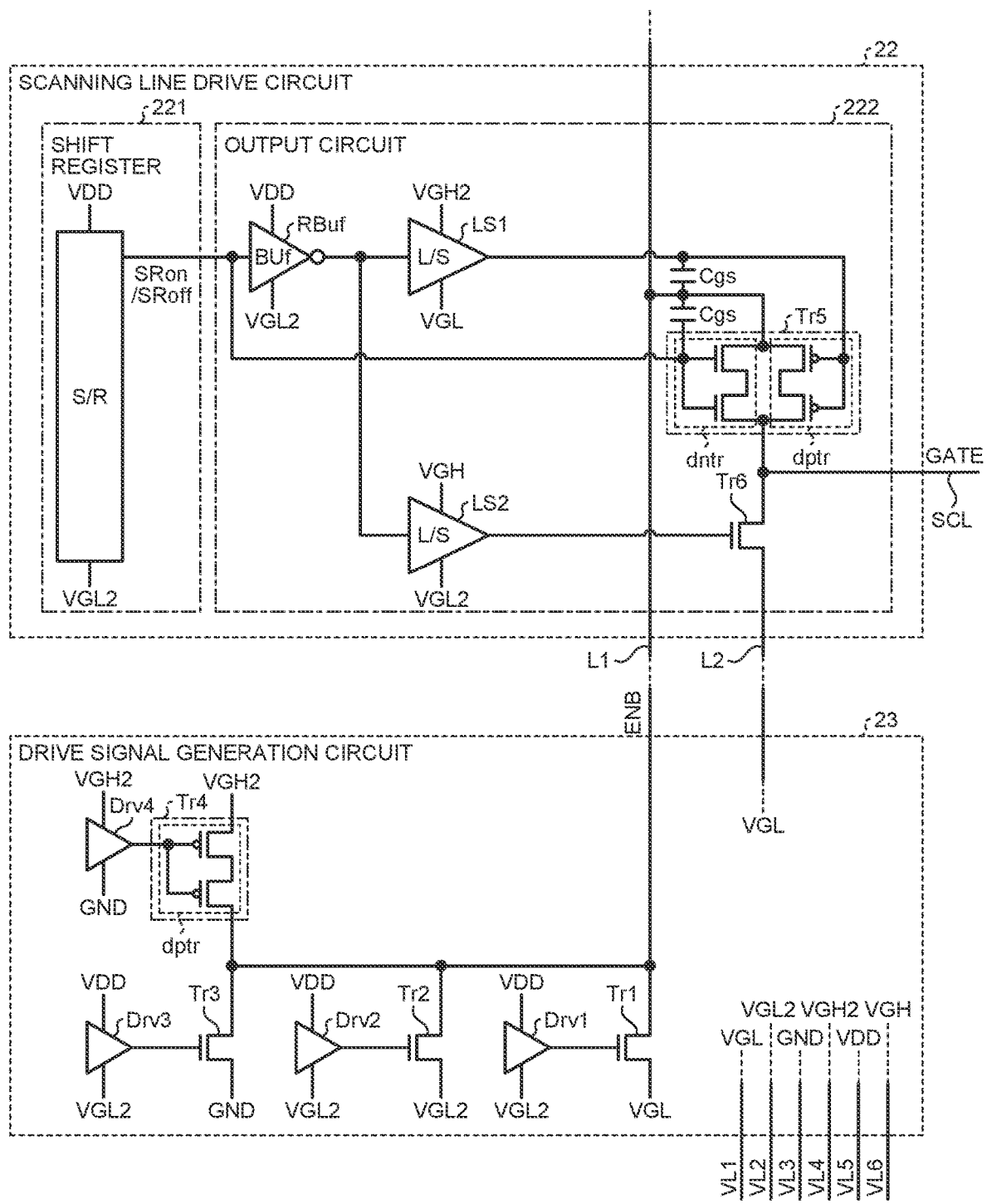
FIG. 4 is a diagram illustrating an example of a configuration of a scanning line drive circuit and a drive signal generation circuit in the display device according to the embodiment.

FIG. 4 is a diagram illustrating an example of a configuration of the scanning line drive circuit and the drive signal generation circuit in the display device according to the embodiment. As illustrated in FIG. 4, the scanning line drive circuit 22 includes a shift register 221, and an output circuit 222 provided for each of the scanning lines SCL. The scanning line drive circuit 22 and the drive signal generation circuit 23 are coupled to each other through a first wire L1. More specifically, the first wire L1 extending from the drive signal generation circuit 23 is coupled to the output circuit 222. The shift register includes a flip-flop circuit corresponding to the output circuit 22. In the following description of configurations and a control, a signal output from the shift register to the output circuits may be understood substantially as an output from the flip-flop circuit corresponding to the output circuit.

In addition, a first power supply line VL1, a second power supply line VL2, a third power supply line VL3, a fourth power supply line VL4, a fifth power supply line VL5, and a sixth power supply line VL6 are provided as power supply lines to the scanning line drive circuit 22 and the drive signal generation circuit 23.

The first potential VGL equal to or lower than an off-potential of the pixel transistor TRD is supplied to the first power supply line VL1.

The second potential VGL2 lower than the first potential VGL is supplied to the second power supply line VL2.

The third potential higher than the first potential VGL is supplied to the third power supply line VL3. In the present embodiment, the third potential is ground potential. Thus, the third potential is denoted by GND.

The fourth potential VGH2 higher than the third potential GND and higher than the on-potential of the pixel transistor TRD is supplied to the fourth power supply line VL4. In the present embodiment, the potential difference between the first potential VGL and the fourth potential VGH2 is set to be equal to or lower than a breakdown potential of the pixel transistor TRD. The potential difference between the second potential VGL2 and the fourth potential VGH2 is set to be equal to or higher than the breakdown potential of the pixel transistor TRD. The breakdown potential of the pixel transistor TRD is, for example, 20 V approximately.

The fifth potential higher than the third potential GND and lower than the fourth potential VGH2 is supplied to the fifth power supply line VL5. The fifth potential is set to be potential VDD equal to the maximum potential VDD1 of the pixel signal. Thus, the fifth potential is denoted by VDD.

The sixth potential VGH higher than the fifth potential VDD and lower than the fourth potential VGH2 is supplied to the sixth power supply line VL6.

The drive signal generation circuit 23 is a circuit configured to generate a gate drive signal ENB for controlling the pixel transistor TRD to be on and off and output the gate drive signal ENB to the scanning line drive circuit 22.

The drive signal generation circuit 23 includes drive circuits Drv1, Drv2, Drv3, and Drv4 and transistors Tr1, Tr2, Tr3, and Tr4.

The transistor Tr1 is, for example, an NMOS transistor. The transistor Tr1 has a gate coupled to the drive circuit Drv1, a source coupled to the first power supply line VL1, and a drain coupled to the first wire L1. The fifth potential VDD and the second potential VGL2 are supplied to the drive circuit Drv1. The transistor Tr1 and the drive circuit Drv1 correspond to a "first potential supply circuit" in the present disclosure.

The transistor Tr2 is, for example, an NMOS transistor. The transistor Tr2 has a gate coupled to the drive circuit Drv2, a source coupled to the second power supply line VL2, and a drain coupled to the first wire L1. The fifth potential VDD and the second potential VGL2 are supplied to the drive circuit Drv2. The transistor Tr2 and the drive circuit Drv2 correspond to a "second potential supply circuit" in the present disclosure.

The transistor Tr3 is, for example, an NMOS transistor. The transistor Tr3 has a gate coupled to the drive circuit Drv3, a source coupled to the third power supply line VL3, and a drain coupled to the first wire L1. The fifth potential VDD and the second potential VGL2 are supplied to the drive circuit Drv4. The transistor Tr3 and the drive circuit Drv3 correspond to a "third potential supply circuit" in the present disclosure.

The transistor Tr4 is configured as, for example, a transistor dptr having a double gate structure including two PMOS transistors. The transistor Tr4 has a gate coupled to the drive circuit Drv4, a source coupled to the fourth power supply line VL4, and a drain coupled to the first wire L1. The fourth potential VGH2 and the third potential GND are supplied to the drive circuit Drv4. The transistor Tr4 and the drive circuit Drv4 correspond to a "fourth potential supply circuit" in the present disclosure.

A second wire L2 is coupled to the output circuit 222 separately from the first wire L1. The second wire L2 is also coupled to the first power supply line VL1.

The drive signal generation circuit 23 generates the gate drive signal ENB by sequentially controlling the transistors Tr1, Tr2, Tr3, and Tr4 to be on and off through the drive circuits Drv1, Drv2, Drv3, and Drv4 as appropriate.

The configurations of the drive circuits Drv1, Drv2, Drv3, and Drv4 and the transistors Tr1, Tr2, Tr3, and Tr4 are not limited to the above-described configurations. For example, the transistor Tr4 may include one PMOS transistor. The present disclosure is not limited by the configurations of the drive circuits Drv1, Drv2, Drv3, and Drv4 and the transistors Tr1, Tr2, Tr3, and Tr4.

The scanning line drive circuit 22 is a circuit configured to sequentially output, to the scanning lines SCL, the scanning signal GATE including the gate drive signal ENB supplied from the drive signal generation circuit 23. In the present embodiment, the scanning signal GATE is made of the gate drive signal ENB including on-control of the pixel transistors TRD, and a gate-off signal that maintains the pixel transistors TRD in the off-state. More specifically, the gate drive signal ENB is a signal from the drive signal generation circuit 23, the gate-off signal is the first potential VGL supplied from the second wire L2, and these signals are switched by the output circuit 222 and supplied to the corresponding scanning line SCL. This switching is executed based on signals SRon and SRoff output from the shift register 221 to the output circuit 222. This drive of the scanning line drive circuit 22 will be described in detail later.

When internal data at the current stage (N-th stage) becomes an on-level (high level), the shift register 221 outputs the gate selection signal SRon to the corresponding output circuit 222 based on a clock signal generated at the display control circuit 20. Thereafter, when the on-level transitions to the next stage ((N−1)-th stage), internal data at the N-th stage in the shift register 221 becomes an off-level (low level). In this case, the shift register 221 outputs the gate non-selection signal SRoff to the output circuit 222 at the N-th stage. In the present embodiment, the shift register 221 is coupled to the second power supply line VL2 and the fifth power supply line VL5 as power sources. Accordingly, the fifth potential VDD from the fifth power supply line VL5 is output as the gate selection signal SRon, and the second potential VGL2 from the second power supply line VL2 is output as the gate non-selection signal SRoff.

The output circuit 222 includes an inversion buffer circuit RBuf, a first level shifter LS1, a second level shifter LS2, a first switch Tr5, and a second switch Tr6. The output end of the first switch Tr5 and the output end of the second switch Tr6 are both coupled to the corresponding scanning line SCL. The input end of the first switch Tr5 is coupled to the first wire L1, and the input end of the second switch Tr6 is coupled to the second wire L2. The first switch Tr5 and the second switch Tr6 are controlled to be on and off based on the output signals SRon and SRoff from the shift register 221. More specifically, the output signals SRon and SRoff from the shift register 221 are supplied to the first switch Tr5 directly or through the inversion buffer circuit RBuf and the first level shifter LS1. The output signals SRon and SRoff from the shift register 221 is also supplied to the second switch Tr6 through the inversion buffer circuit RBuf and the second level shifter LS2. The first switch Tr5 and the second switch Tr6 correspond to a "switch circuit" in the present disclosure.

The inversion buffer circuit RBuf inverts and outputs the output signals SRon and SRoff from the shift register 221. More specifically, the inversion buffer circuit RBuf is coupled to the second power supply line VL2 and the fifth power supply line VL5 as power sources and outputs the second potential VGL2 from the second power supply line VL2 when having received the gate selection signal SRon from the shift register 221. Similarly, the inversion buffer circuit RBuf outputs the fifth potential VDD from the fifth power supply line VL5 when having received the gate non-selection signal SRoff from the shift register 221.

The first level shifter LS1 is coupled to the first power supply line VL1 and the fourth power supply line VL4 as power sources and outputs the fourth potential VGH2 or the first potential VGL in accordance with an input signal. More specifically, the first level shifter LS1 is a circuit configured to perform level conversion of the output into the fourth potential VGH2 and output the fourth potential VGH2 when the output from the inversion buffer circuit RBuf is at a high level (the fifth potential VDD), and configured to perform level conversion of the output into the first potential VGL and output the first potential VGL when the output from the inversion buffer circuit RBuf is at a low level (the second potential VGL2). The positive-side output and the negative-side output from the first level shifter LS1 are higher than the input potential. The output potential difference becomes large.

The second level shifter LS2 is coupled to the second power supply line VL2 and the sixth power supply line VL6 as power sources and outputs the sixth potential VGH or the second potential VGL2 in accordance with an input signal. More specifically, the second level shifter LS2 is a circuit configured to perform level conversion of the output into the sixth potential VGH and output the sixth potential VGH when the output from the inversion buffer circuit RBuf is at the high level (the fifth potential VDD), and configured to perform level conversion of the output into the second potential VGL2 and output the second potential VGL2 when the output from the inversion buffer circuit RBuf is at the low level (the second potential VGL2). The positive-side output from the second level shifter LS2 is higher than the input potential. The output potential difference becomes large.

The first switch Tr5 has, for example, a CMOS structure in which a transistor dptr having a double gate structure including two PMOS transistors is coupled in parallel with a transistor dntr having a double gate structure including two NMOS transistors. The inversion buffer circuit RBuf and the first level shifter LS1 are provided between the transistor dptr and the shift register 221, and the transistor dptr is controlled to be on and off by an output signal from the first level shifter LS1. The gate of the transistor dptr is directly coupled to the output end of the shift register 221, and on/off-control thereof is performed by the output signals SRon and SRoff from the shift register 221. As the transistor dptr and the transistor dntr are controlled to be on and off based on the output signals SRon and SRoff from the shift register 221, the first switch Tr5 outputs, to the scanning line SCL, the gate drive signal ENB output from the drive signal generation circuit 23.

The second switch Tr6 is, for example, an NMOS transistor. The inversion buffer circuit RBuf and the second level shifter LS2 are provided between the second switch Tr6 and the shift register 221, and the second switch Tr6 is controlled to be on and off based on an output signal from the second level shifter LS2. The second switch Tr6 outputs, through on/off-control based on the output from the second level shifter LS2, the first potential VGL to be output from the second wire L2.

The switch circuit couples the first wire L1 or the second wire L2 to the scanning line SCL based on the output signals SRon and SRoff from the shift register 221. More specifically, the first switch Tr5 is provided between the first wire L1 and the scanning line SCL, and the second switch Tr6 is provided between the second wire L2 and the scanning line SCL. The first wire L1 and the second wire L2 are complementarily driven based on the output signals SRon and SRoff from the shift register 221. Specifically, when the gate selection signal SRon is output from the shift register 221, the first switch Tr5 is turned on and the second switch Tr6 is turned off. When the gate non-selection signal SRoff is output from the shift register 221, the second switch Tr6 is turned on and the first switch Tr5 is turned off.

In this manner, the scanning signal GATE to be supplied to each of the scanning lines SCL is formed by sequentially switching the gate drive signal ENB from the first wire L1 and the gate-off signal (first potential VGL) from the second wire L2 in a time divisional manner. More specifically, the gate drive signal ENB is supplied to the scanning line SCL for a predetermined period, and accordingly, the corresponding pixel transistors TRD are driven. For a period in which the gate drive signal ENB is not supplied, the gate-off signal (first potential VGL) is supplied to a scanning line SCL, and accordingly, the corresponding pixel transistors TRD are maintained in a non-driven state (gate-off state). A generation order of the scanning signals GATE will be described below.

Figure 5A:
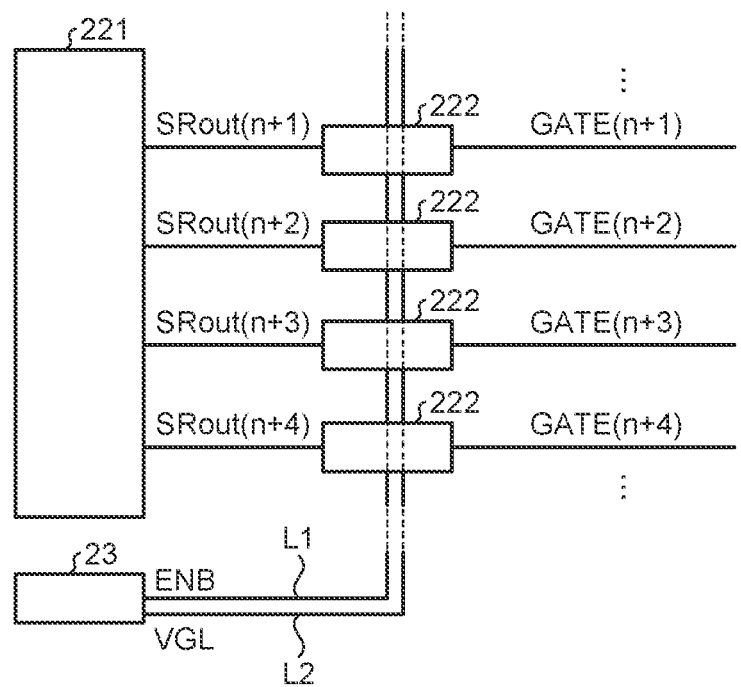
FIG. 5A is a diagram illustrating a first exemplary configuration indicating a correspondence relation between a drive signal generation circuit and output circuits.
Figure 5B:
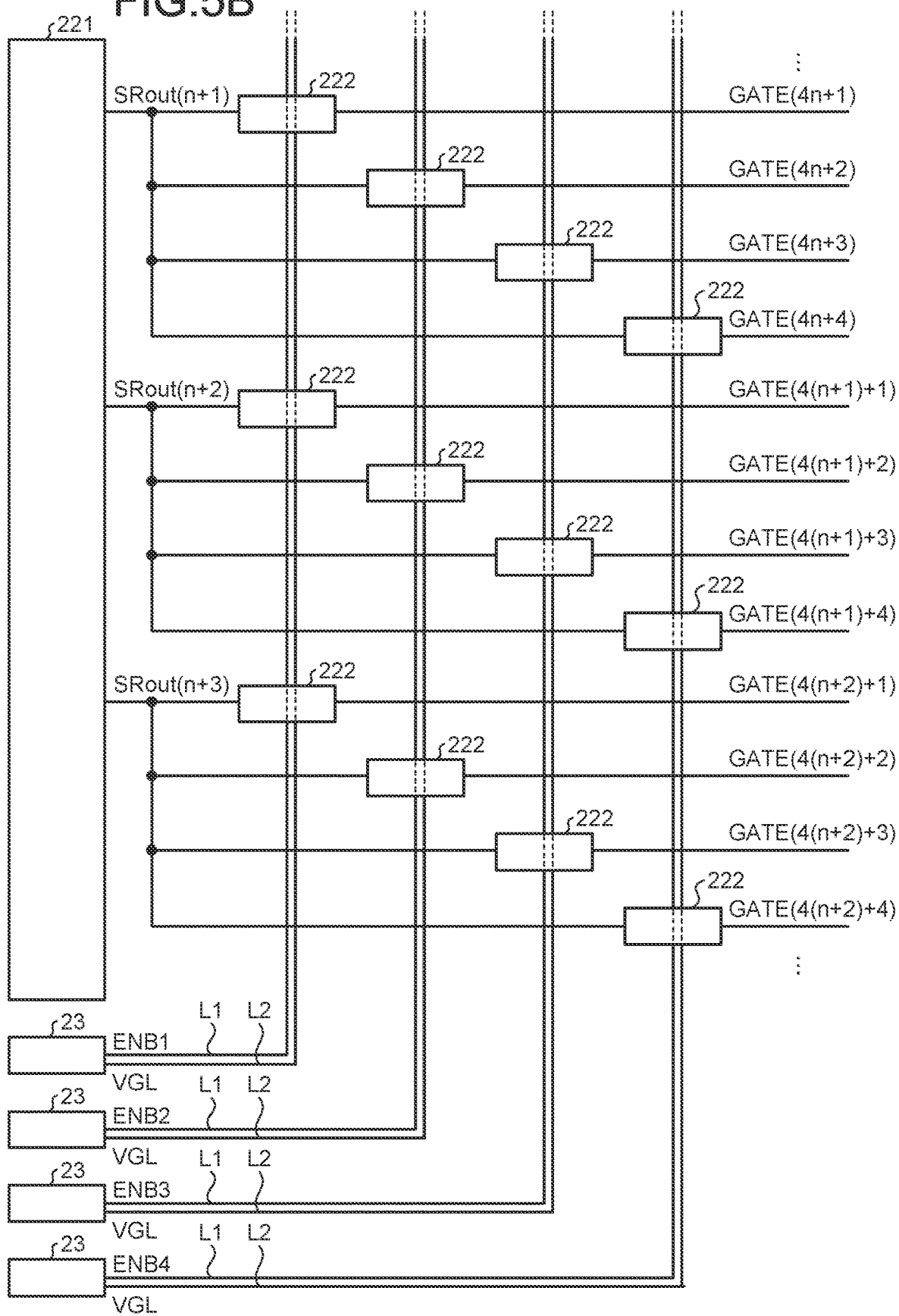
FIG. 5B is a diagram illustrating a second exemplary configuration indicating the correspondence relation between the drive signal generation circuit and the output circuits.
Figure 6A:
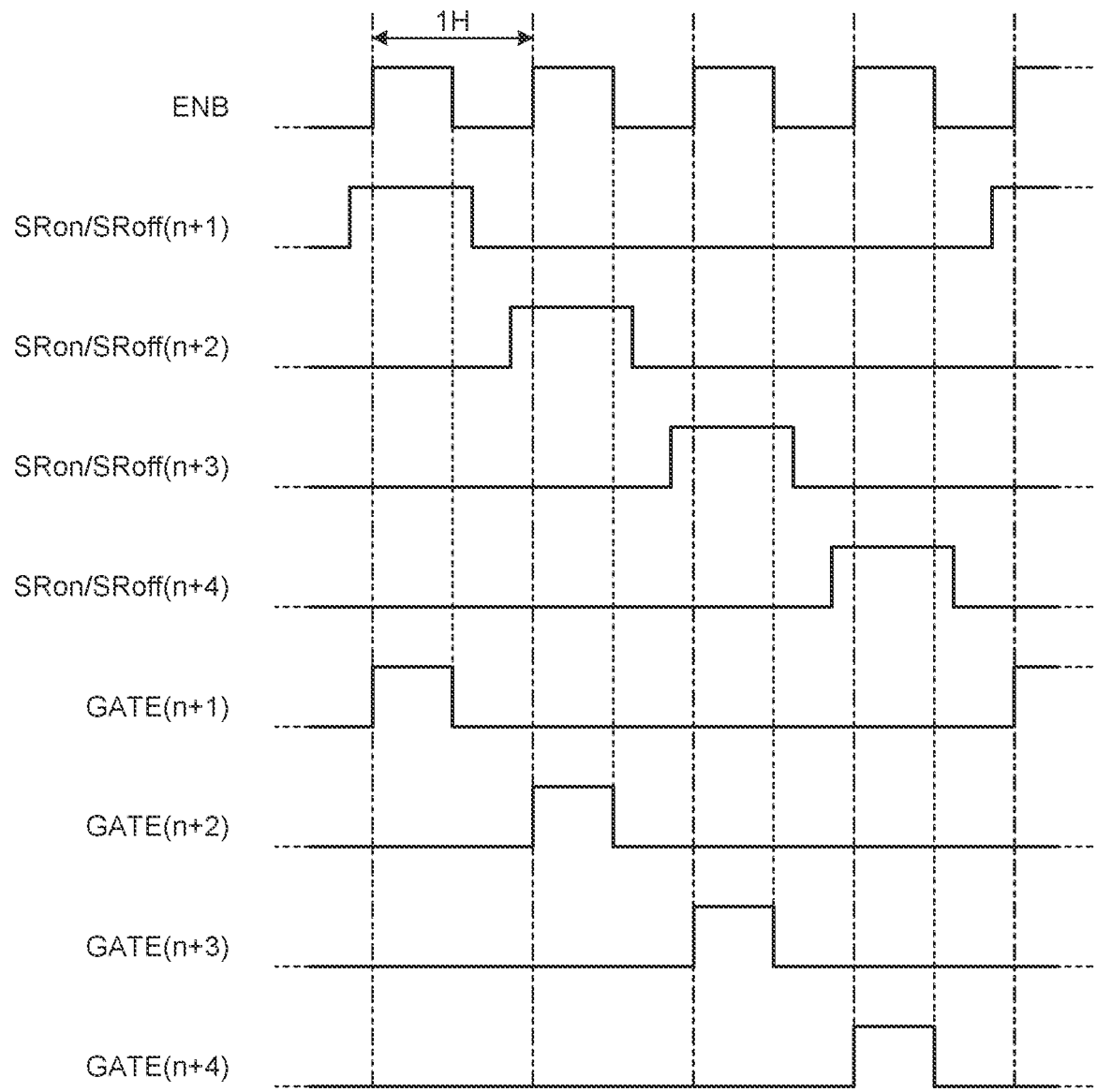
FIG. 6A is a timing chart of components in the first exemplary configuration illustrated in FIG. 5A.
Figure 6B:
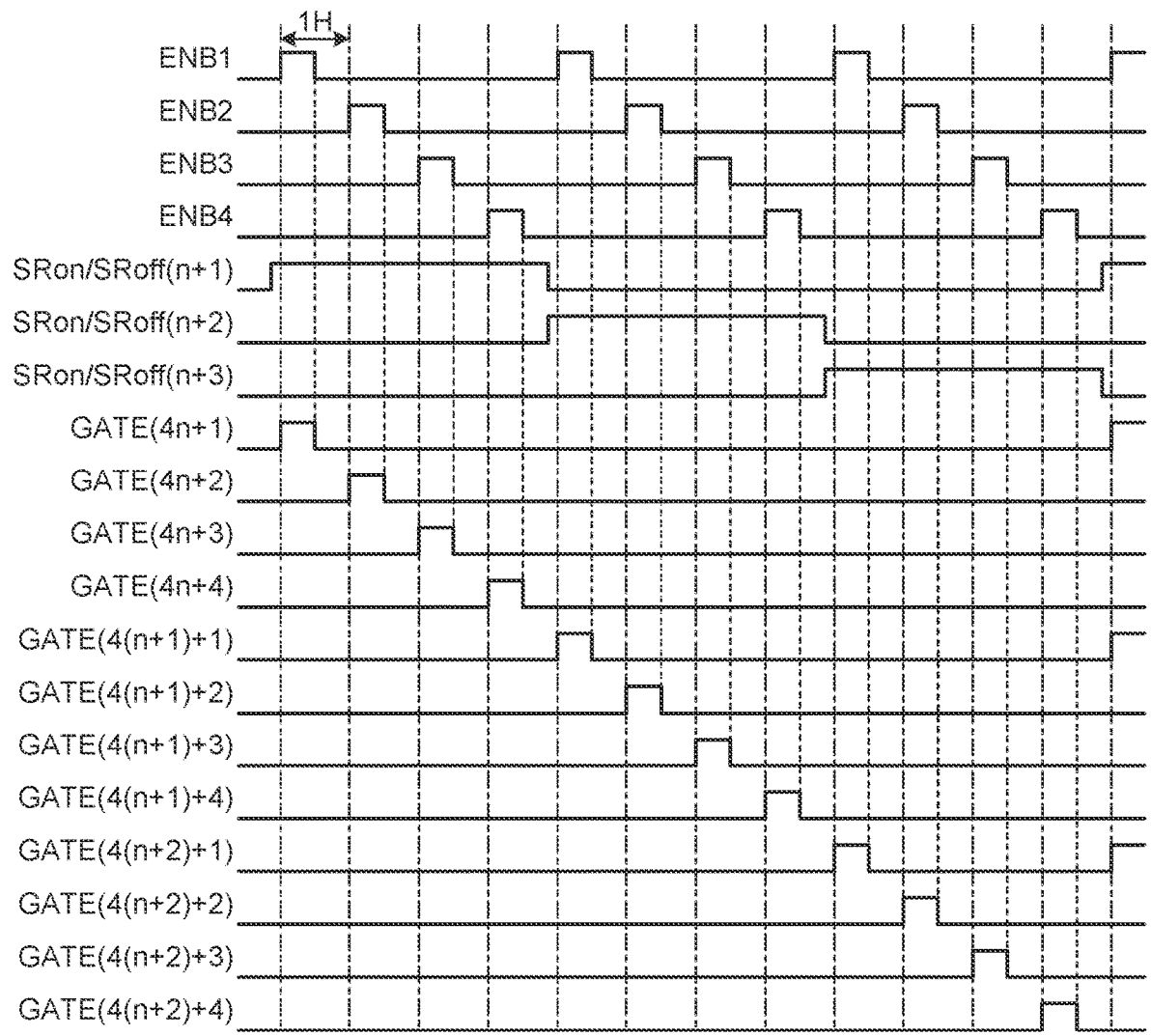
FIG. 6B is a timing chart of components in the second exemplary configuration illustrated in FIG. 5B.

FIG. 5A is a diagram illustrating a first exemplary configuration indicating a correspondence relation between the drive signal generation circuit and the output circuits. FIG. 5B is a diagram illustrating a second exemplary configuration indicating a correspondence relation between the drive signal generation circuit and the output circuits. FIG. 6A is a timing chart of components in the first exemplary configuration illustrated in FIG. 5A. FIG. 6B is a timing chart of components in the second exemplary configuration illustrated in FIG. 5B. In FIGS. 5A, 5B, 6A, and 6B, n is an integer equal to or higher than zero. The gate drive signals ENB and the scanning signals GATE in FIGS. 6A and 6B are illustrated in simplified shapes different from their original waveforms to indicate a relation with the output signals SRon and SRoff output from the shift register 221.

As illustrated in FIGS. 5A and 6A, the gate drive signal ENB for all of the output circuits 222 is output from the single drive signal generation circuit 23. The drive signal generation circuit 23 generates one gate drive signal ENB in each horizontal period 1H based on the clock signal supplied from the display control circuit 20, and supplies the gate drive signal ENB to the first wire L1. In addition, the gate selection signal SRon output from the shift register 221 is output to the corresponding output circuit 222, and accordingly, one scanning line SCL to which the gate drive signal ENB is to be supplied through the first wire L1 is sequentially selected. In this case, all of the remaining outputs from the shift register 221 are the gate non-selection signals SRoff, and the gate-off signal (first potential VGL) from the second wire L2 is supplied to the corresponding scanning lines SCL.

As illustrated in FIGS. 5B and 6B, gate drive signals ENB1, ENB2, ENB3, and ENB4 shifted from each other by the one horizontal period 1H may be generated by four drive signal generation circuits 23 respectively, and supplied to the first wire L1. Then, one scanning line SCL to which the gate drive signals ENB1, ENB2, ENB3, and ENB4 are to be supplied through the first wire L1 may be sequentially selected as the gate selection signal SRon output from the shift register 221 is output to the corresponding output circuit 222. In this manner, it is possible to reduce a total capacitance of parasitic capacitances Cgs (refer to FIG. 4) of supply paths of the gate drive signals ENB1, ENB2, ENB3, and ENB4.

Figure 7:
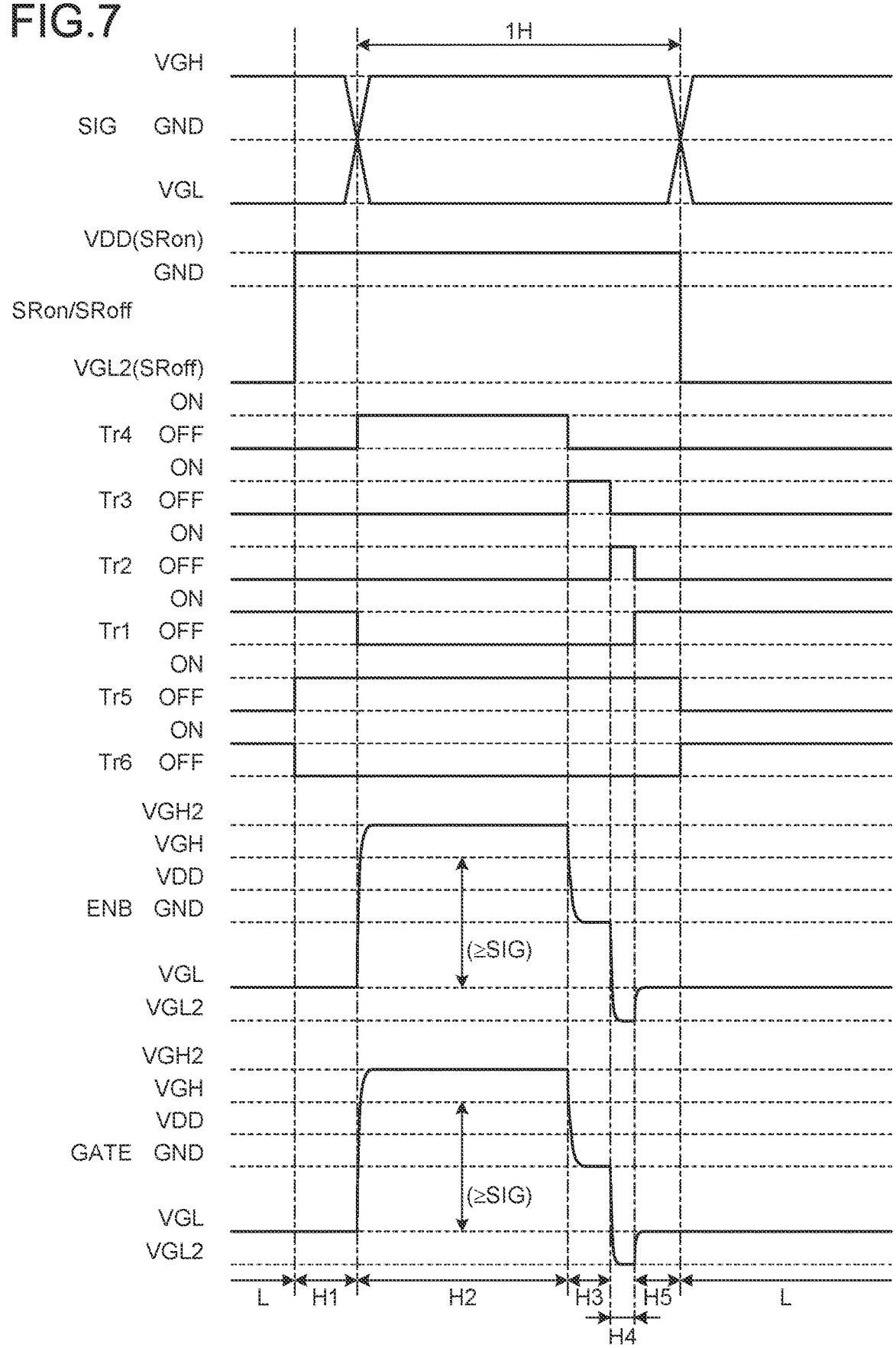
FIG. 7 is a timing chart for explaining operation of each of components of the scanning line drive circuit and the drive signal generation circuit according to the embodiment, and is a diagram illustrating exemplary waveforms of a gate drive signal ENB and a scanning signal GATE.
Figure 8A:
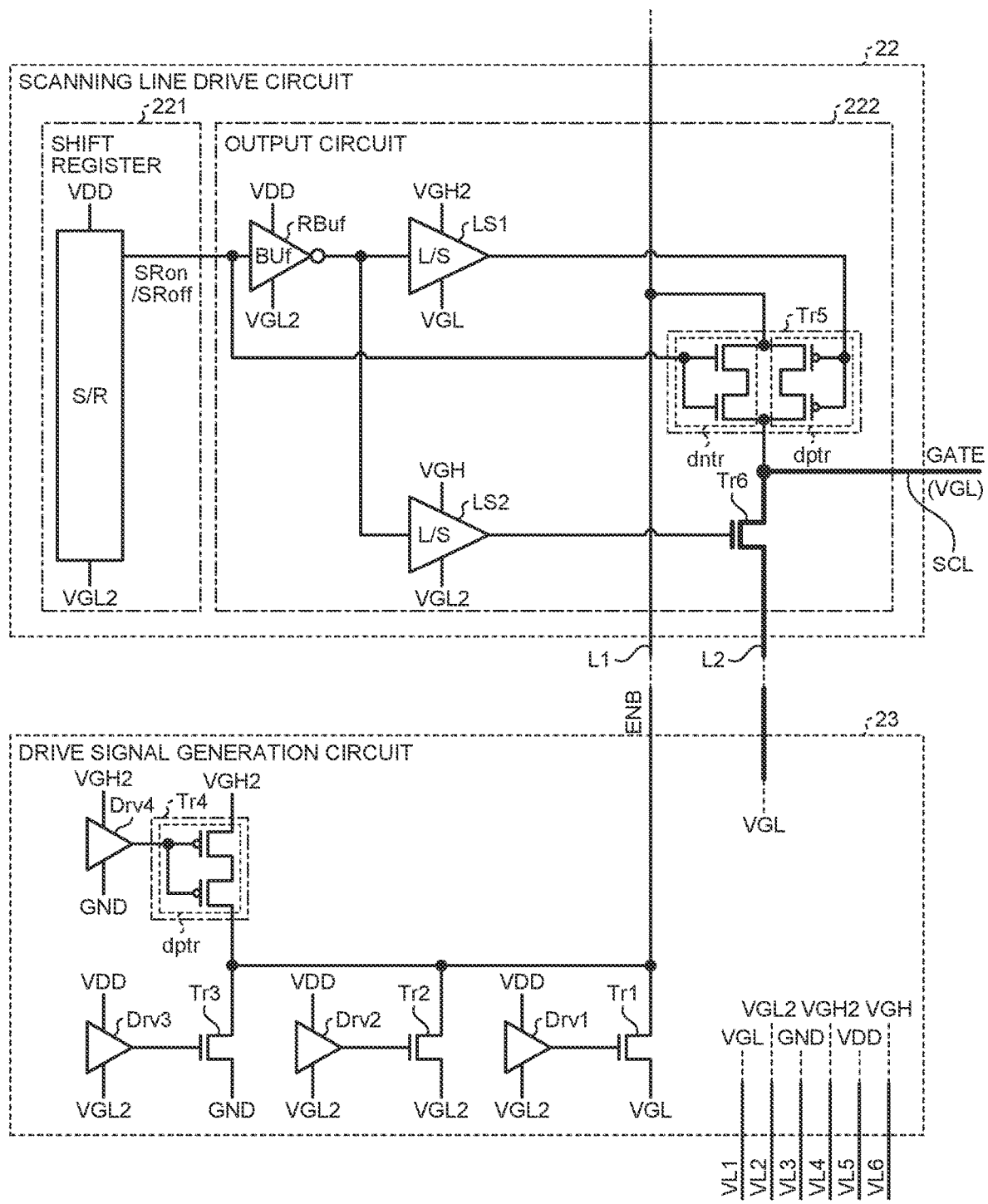
FIG. 8A is a diagram illustrating a gate drive signal path in period L illustrated in FIG. 7.
Figure 8B:
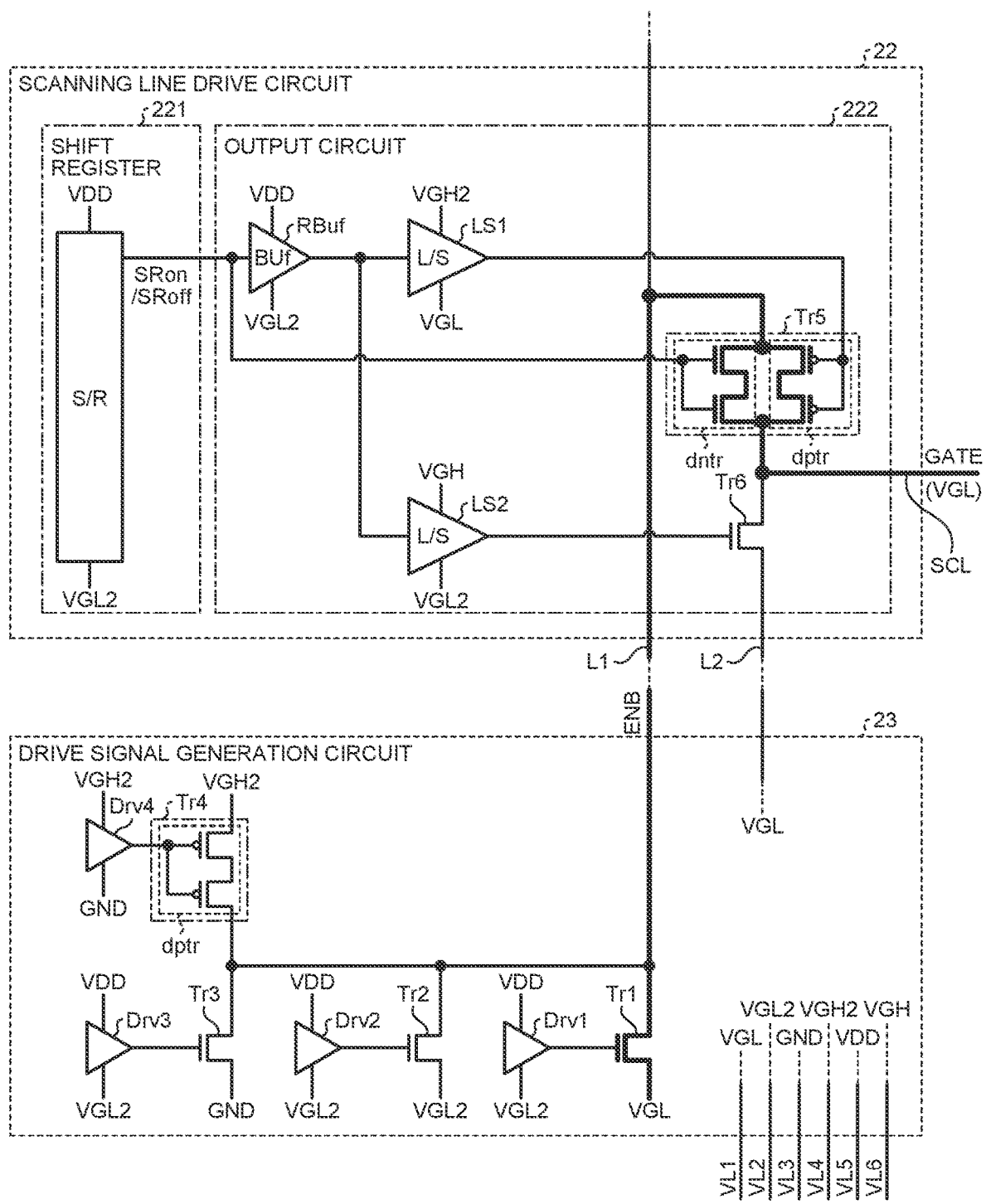
FIG. 8B is a diagram illustrating the gate drive signal path in periods H1 and H5 illustrated in FIG. 7.
Figure 8C:
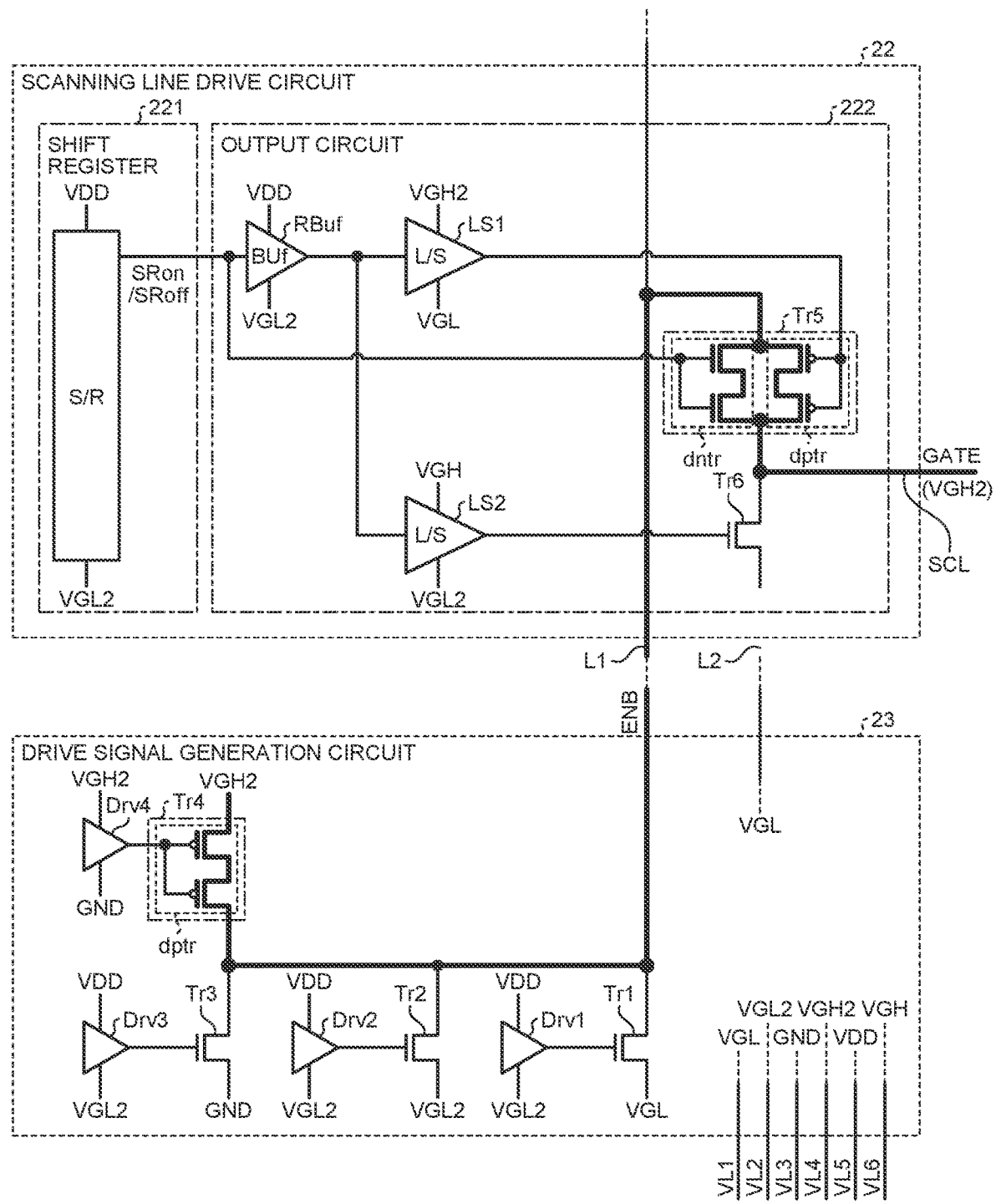
FIG. 8C is a diagram illustrating the gate drive signal path in period H2 illustrated in FIG. 7.
Figure 8D:
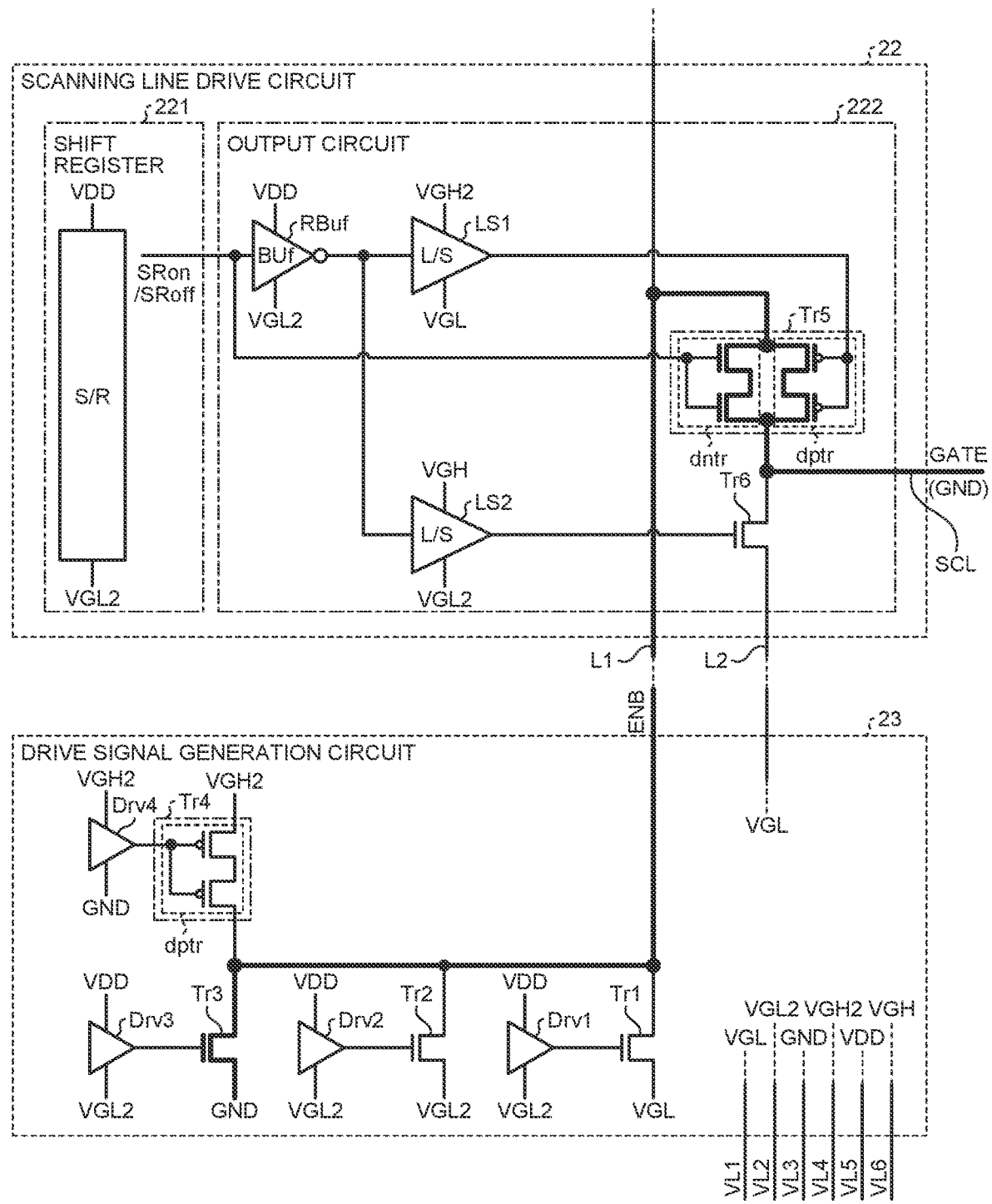
FIG. 8D is a diagram illustrating the gate drive signal path in period H3 illustrated in FIG. 7.
Figure 8E:
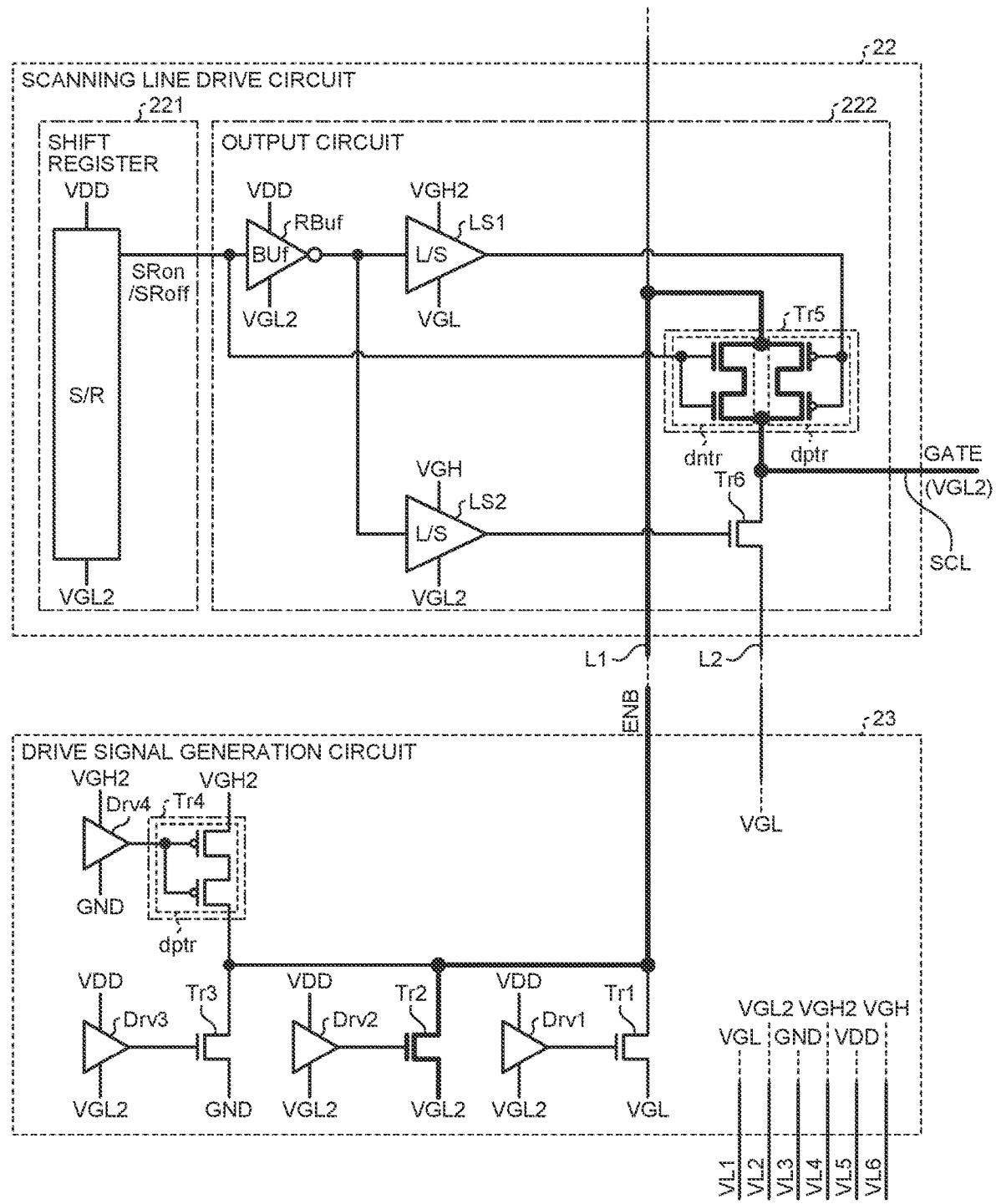
FIG. 8E is a diagram illustrating the gate drive signal path in period H4 illustrated in FIG. 7.

The following describes operation in the configuration of the above-described embodiment. FIG. 7 is a timing chart for description of operation of each of the components of the scanning line drive circuit and the drive signal generation circuit according to the embodiment, and is a diagram illustrating exemplary waveforms of the gate drive signal ENB and the scanning signal GATE. FIG. 8A is a diagram illustrating a gate drive signal path in period L illustrated in FIG. 7. FIG. 8B is a diagram illustrating a gate drive signal path in periods H1 and H5 illustrated in FIG. 7. FIG. 8C is a diagram illustrating a gate drive signal path in period H2 illustrated in FIG. 7. FIG. 8D is a diagram illustrating a gate drive signal path in period H3 illustrated in FIG. 7. FIG. 8E is a diagram illustrating a gate drive signal path in period H4 illustrated in FIG. 7. In the examples illustrated in FIGS. 8A to 8E, a potential supply path to a scanning line SCL is illustrated with a bold line.

As illustrated in FIG. 7, in the period of the gate selection signal SRon output from the shift register 221, the output circuit 222 outputs the gate drive signal ENB output from the drive signal generation circuit 23. Specifically, the scanning line SCL to which the gate drive signal ENB is to be supplied is selected by the gate selection signal SRon. Hereinafter, the period of the gate selection signal SRon is also referred to as a "selection period of a scanning line SCL". In addition, the period of the gate non-selection signal SRoff is also referred to as a "non-selection period of a scanning line SCL".

As illustrated in FIG. 8A, in the non-selection period of a scanning line SCL (period L illustrated in FIG. 7), the shift register 221 outputs the gate non-selection signal SRoff toward the corresponding output circuit 222. When the gate non-selection signal SRoff is input from the shift register 221 to the output circuit 222, the gate non-selection signal SRoff is directly supplied to the gate of the transistor dntr of the first switch Tr5. The gate non-selection signal SRoff has the second potential VGL2 of the second power supply line VL2, and accordingly, the transistor dntr is controlled to be off. The gate non-selection signal SRoff is also input to the inversion buffer circuit RBuf and supplied to the first level shifter LS1 and the second level shifter LS2 as a non-selection inversion signal. In response to input of the non-selection inversion signal, the first level shifter LS1 outputs the fourth potential VGH2 toward the gate of the transistor dptr. Accordingly, the transistor dptr is controlled to be off. On the other hand, in response to input of the non-selection inversion signal, the second level shifter LS2 outputs the sixth potential VGH toward the gate of the second switch Tr6. Accordingly, the second switch Tr6 is controlled to be on. As a result, the second wire L2 is coupled to a scanning line SCL, and the gate-off signal (first potential VGL) is supplied to the scanning line SCL. Accordingly, the pixel transistor TRD of each of the pixels PX coupled to the scanning line SCL is controlled to be off, and the signal line DTL and the pixel electrode Pix (pixel capacitor CS) thereof are uncoupled. Alternatively, the pixel electrode Pix is maintained in a floating state.

In this non-selection period, the transistor Tr1 is controlled to be on and the transistors Tr2, Tr3, and Tr4 are controlled to be off in the drive signal generation circuit 23. Accordingly, the first switch Tr5 of the output circuit 222 in the non-selection period is controlled to be off but supplied with potential equal to that of the second wire L2 (refer to FIG. 8A).

Subsequently, transition is made based on the clock signal to selection periods (H1 to H5) in which the scanning line SCL is selected.

Specific drive of the scanning line drive circuit 22 and the drive signal generation circuit 23 in the period H1 illustrated in FIG. 7 is illustrated in FIG. 8B. In the period H1, the shift register 221 outputs the gate selection signal SRon toward the corresponding output circuit 222. When the gate selection signal SRon is input from the shift register 221 to the output circuit 222, the gate selection signal SRon is directly supplied to the gate of the transistor dntr of the first switch Tr5, and accordingly, the transistor dntr is controlled to be on. The gate selection signal SRon is also input to the inversion buffer circuit RBuf and supplied to the first level shifter LS1 and the second level shifter LS2 as a selection inversion signal. In response to input of the selection inversion signal, the first level shifter LS1 outputs the first potential VGL toward the gate of the transistor dptr. Accordingly, the transistor dptr is controlled to be off (maintained in off-control). Accordingly, the first switch Tr5 as a whole is controlled to be on, and the scanning line SCL is coupled to the first wire L1. On the other hand, in response to input of the selection inversion signal, the second level shifter LS2 outputs the second potential VGL2 toward the gate of the second switch Tr6. Accordingly, the second switch Tr6 is controlled to be off. As a result, the second wire L2 and the scanning line SCL are uncoupled.

Simultaneously in the drive signal generation circuit 23, the transistor Tr1 is controlled to be on and the transistors Tr2, Tr3, and Tr4 are controlled to be off based on the clock signal. Accordingly, the potential of the gate drive signal ENB becomes the first potential VGL and is supplied to the scanning line SCL through the first wire L1 and the first switch Tr5 of the output circuit 222 (refer to FIG. 8B).

Writing to the pixel electrode Pix is performed in one horizontal period 1H of the pixel signal SIG.

In the period H2 illustrated in FIG. 7, the output from the shift register 221 is maintained as the gate selection signal SRon, and thus the state of the output circuit 222 is maintained as in the period H1. Simultaneously in the drive signal generation circuit 23, the transistor Tr4 is controlled to be on and the transistors Tr1, Tr2, and Tr3 are controlled to be off based on the clock signal. Accordingly, the potential of the gate drive signal ENB becomes the fourth potential VGH2 and is supplied to the scanning line SCL through the first switch Tr5 of the output circuit 222 (refer to FIG. 8C). Accordingly, the pixel transistor TRD of each of the pixels PX coupled to the scanning line SCL is controlled to be on. At this timing, the pixel signal SIG for each of the pixels PX is input to the corresponding signal line DTL and then input to the pixel capacitor CS through the pixel transistor TRD controlled to be on. Hereinafter, the period H2 illustrated in FIG. 7 is also referred to as a "charging period of the pixel capacitor CS".

In the period H3 illustrated in FIG. 7, the output from the shift register 221 is maintained as the gate selection signal SRon, and thus the state of the output circuit 222 is maintained as in the period H1. Simultaneously in the drive signal generation circuit 23, the transistor Tr3 is controlled to be on and the transistors Tr1, Tr2, and Tr4 are controlled to be off based on the clock signal. Accordingly, the potential of the gate drive signal ENB becomes the third potential GND and is supplied to the first wire L1. Then, the potential of the first wire L1 decreases from the fourth potential VGH2 to the third potential GND. This potential is higher than the gate potential of the transistor dptr of the first switch Tr5 and lower than the gate potential of the transistor dntr thereof. Accordingly, the transistor dptr is maintained in on-control and the transistor dntr is changed from off-control to on-control. The first switch Tr5 as a whole is maintained in on-control and the second switch Tr6 is maintained in off-control. Thus, the first wire L1 is coupled to the scanning line SCL through the first switch Tr5, and the gate drive signal ENB at the third potential GND is input to the scanning line SCL (refer to FIG. 8D).

In the period H4 illustrated in FIG. 7, the output from the shift register 221 is maintained as the gate selection signal SRon, and thus the state of the output circuit 222 is maintained as in the period H1. Simultaneously in the drive signal generation circuit 23, the transistor Tr2 is controlled to be on and the transistors Tr1, Tr3, and Tr4 are controlled to be off based on the clock signal. Accordingly, the potential of the gate drive signal ENB becomes the second potential VGL2 and is supplied to the first wire L1. Then, the potential of the first wire L1 decreases from the third potential GND to the second potential VGL2. This potential is lower than the gate potential of the transistor dptr of the first switch Tr5 and lower than the gate potential of the transistor dntr thereof. Accordingly, the transistor dntr is maintained in on-control and the transistor dptr is changed from on-control to off-control. The first switch Tr5 as a whole is maintained in on-control and the second switch Tr6 is maintained in off-control. Thus, the first wire L1 is coupled to the scanning line SCL through the first switch Tr5, and the gate drive signal ENB at the second potential VGL2 is input to the scanning line SCL.

The second potential VGL2 is lower than the first potential VGL. Accordingly, the gate of the pixel transistor TRD of each of the pixels PX coupled to the scanning line SCL is controlled to be off, and input of the pixel signal SIG to each of the pixel capacitors CS from the corresponding signal line DTL stops. The pixel capacitor CS side becomes what is called a floating state (refer to FIG. 8E).

In the period H5 illustrated in FIG. 7, the output from the shift register 221 is maintained as the gate selection signal SRon, and thus the state of the output circuit 222 is maintained as in the period H1. Simultaneously in the drive signal generation circuit 23, the transistor Tr1 is controlled to be on again and the transistors Tr2, Tr3, and Tr4 are controlled to be off based on the clock signal. Accordingly, the potential of the gate drive signal ENB becomes the first potential VGL and is output to the first wire L1. Then, the potential of the first wire L1 increases from the second potential VGL2 to the first potential VGL. This potential is equal to the gate potential of the transistor dptr of the first switch Tr5 and lower than the gate potential of the transistor dntr. Accordingly, the transistor dntr is maintained in on-control and the transistor dptr is also maintained in off-control. The first switch Tr5 as a whole is maintained in on-control and the second switch Tr6 is maintained in off-control. Thus, the first wire L1 is coupled to the scanning line SCL through the first switch Tr5, and the gate drive signal ENB of the first potential VGL is input to the scanning line SCL. The first potential VGL is what is called gate-off potential, and accordingly, the off-state of the pixel transistor TRD of each of the pixels PX is maintained (refer to FIG. 8B).

Thereafter, the selection period of a scanning line SCL at the current stage ends. Specifically, the shift register 221 outputs the gate non-selection signal SRoff toward the corresponding output circuit 222. As a result, the output circuit 222 becomes the drive state illustrated in FIG. 8A, and accordingly, the first switch Tr5 is controlled to be off and the second switch Tr6 is controlled to be on. As a result, the second wire L2 is coupled to the corresponding scanning line SCL, and the gate-off potential (first potential VGL) is supplied to the scanning line SCL. Accordingly, the pixel transistor TRD of each of the pixels PX coupled to the scanning line SCL is maintained in off-control.

Since the selection period at the current stage ends, transition is made to the selection period at the next stage. In the next horizontal period, the above-described drive in H1 to H5 is performed for an output circuit 222 at the next stage, which is selected by the shift register 221, and the corresponding scanning line SCL. In this manner, the output circuit 222 is maintained in a state in the non-selection period until the next selection period, but the drive signal generation circuit 23 repeats the above-described drive in FIGS. 8B to 8E for each of the horizontal periods. Accordingly, the gate drive signal ENB is supplied to a scanning line SCL at each stage.

Figure 9:
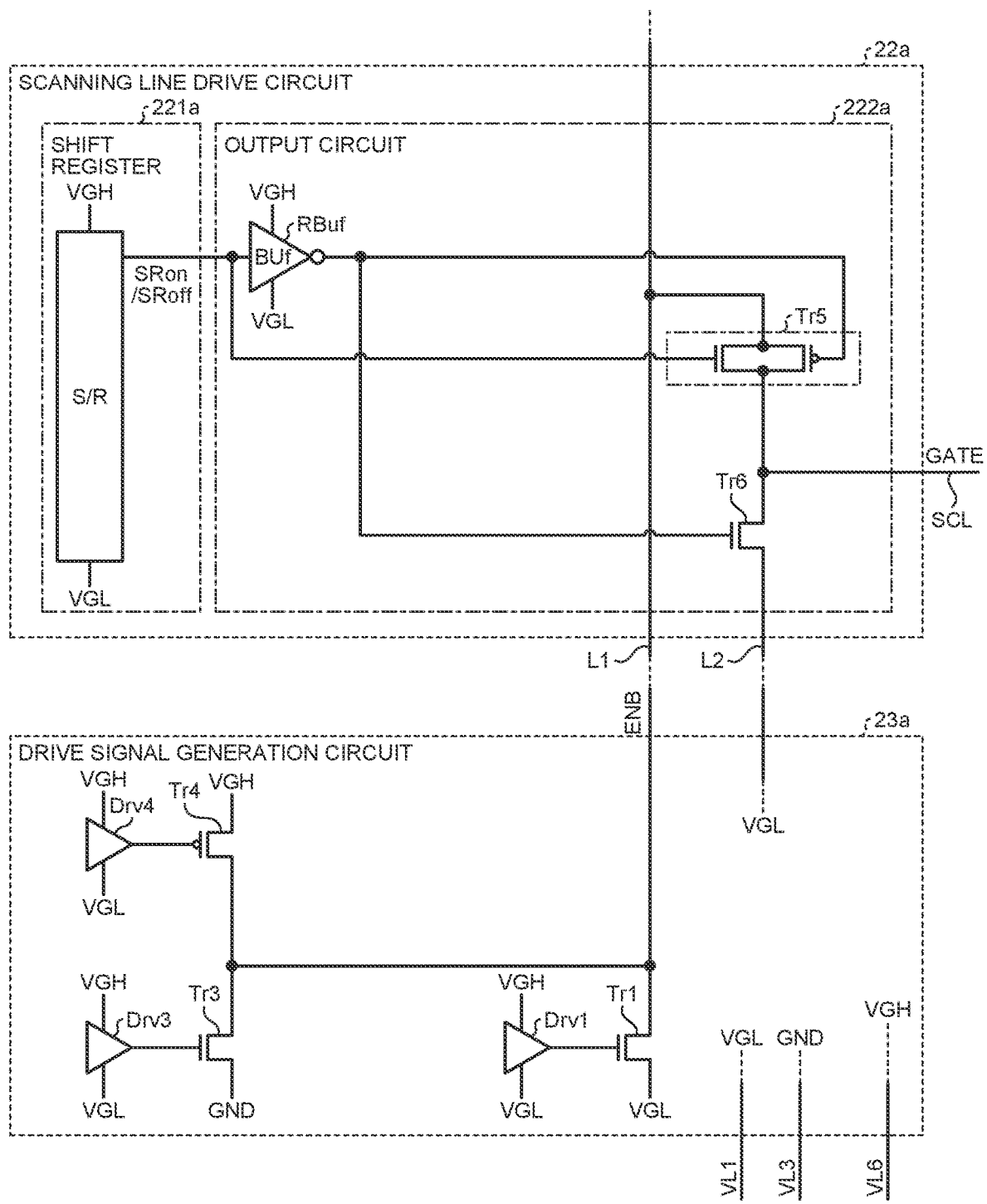
FIG. 9 is a diagram illustrating an example of a configuration of a scanning line drive circuit and a drive signal generation circuit in a display device according to a second example of the embodiment.
Figure 10:
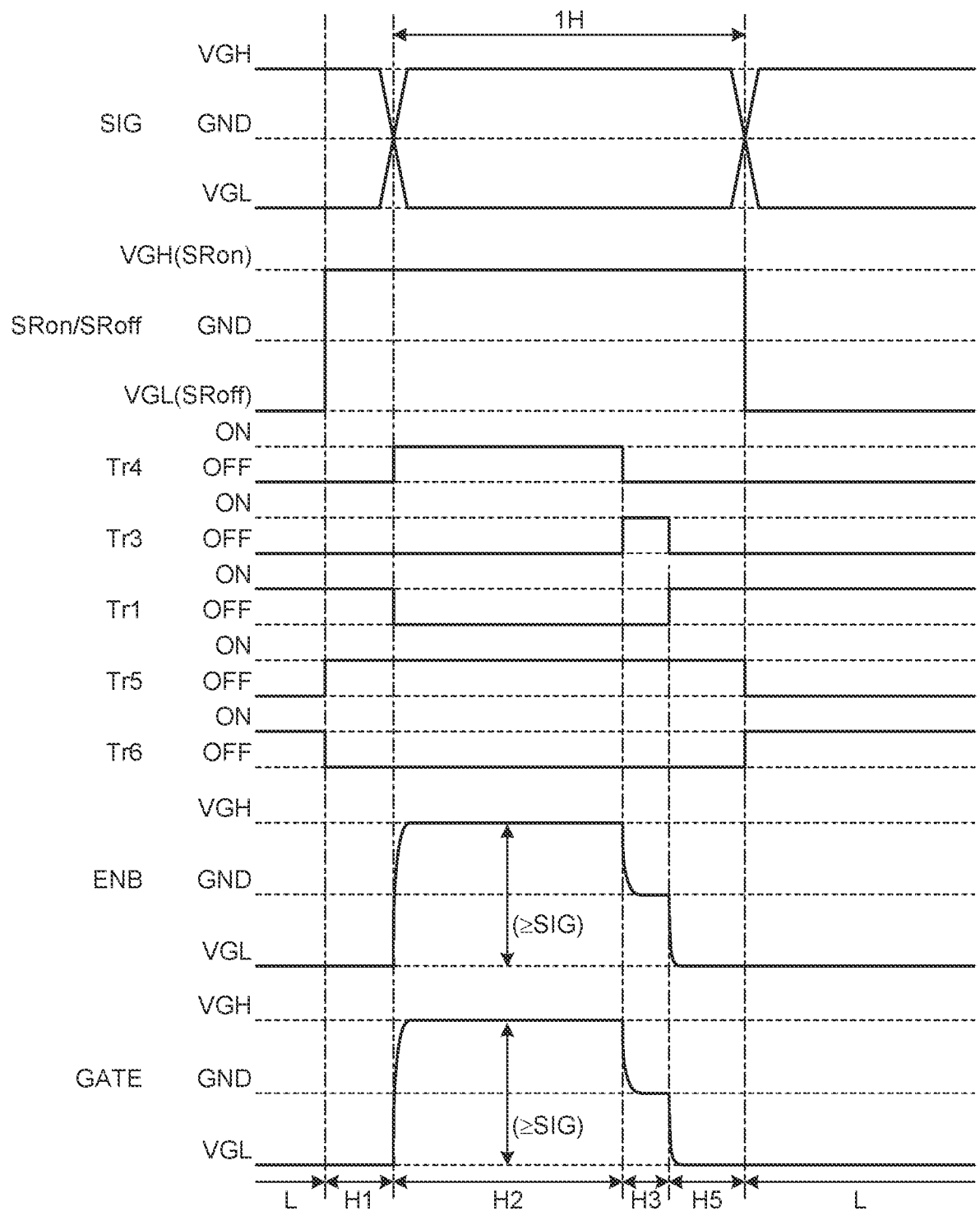
FIG. 10 is a timing chart for explaining operation of each of components of the scanning line drive circuit and the drive signal generation circuit according to the second example of the embodiment, and is a diagram illustrating exemplary waveforms of a gate drive signal ENB and a scanning signal GATE.

The following describes a second example of the embodiment with reference to FIGS. 9 to 11. FIG. 9 is a diagram illustrating an example of a configuration of a scanning line drive circuit and a drive signal generation circuit in a display device according to the second example of the embodiment. FIG. 10 is a timing chart for description of operation of each of the components of the scanning line drive circuit and the drive signal generation circuit according to the second example of the embodiment and is a diagram illustrating exemplary waveforms of the gate drive signal ENB and the scanning signal GATE. FIG. 11A is a diagram illustrating a gate drive signal path in period L illustrated in FIG. 10. FIG. 11B is a diagram illustrating a gate drive signal path in periods H1 and H5 illustrated in FIG. 10. FIG. 11C is a diagram illustrating a gate drive signal path in period H2 illustrated in FIG. 10. FIG. 11D is a diagram illustrating a gate drive signal path in period H3 illustrated in FIG. 10. In the examples illustrated in FIGS. 11A to 11D, a potential supply path to a scanning line SCL is illustrated with a bold line.

First, a configuration according to the second example of the embodiment will be described below.

As illustrated in FIG. 9, a scanning line drive circuit 22a includes a shift register 221a and an output circuit 222a.

A drive signal generation circuit 23a includes the drive circuits Drv1, Drv3, and Drv4 and the transistors Tr1, Tr3, and Tr4.

The transistor Tr1 is, for example, an NMOS transistor. The transistor Tr1 has a gate coupled to the drive circuit Drv1, a source coupled to the first power supply line VL1, and a drain coupled to the first wire L1. The sixth potential VGH and the first potential VGL are supplied to the drive circuit Drv1.

The transistor Tr3 is, for example, an NMOS transistor. The transistor Tr3 has a gate coupled to the drive circuit Drv3, a source coupled to the third power supply line VL3, and a drain coupled to the first wire L1. The sixth potential VGH and the first potential VGL are supplied to the drive circuit Drv4.

The transistor Tr4 is, for example, a PMOS transistor. The transistor Tr4 has a gate coupled to the drive circuit Drv4, a source coupled to the sixth power supply line VL6, and a drain coupled to the first wire L1. The sixth potential VGH and the first potential VGL are supplied to the drive circuit Drv4.

The second wire L2 is coupled to the output circuit 222a separately from the first wire L1. The second wire L2 is also coupled to the first power supply line VL1.

The drive signal generation circuit 23a generates the gate drive signal ENB by sequentially controlling the transistors Tr1, Tr3, and Tr4 to be on and off through the drive circuits Drv1, Drv3, and Drv4 as appropriate.

The scanning line drive circuit 22a is a circuit configured to sequentially output, to the scanning lines SCL, the scanning signal GATE including the gate drive signal ENB supplied from the drive signal generation circuit 23a.

The shift register 221a has a configuration same as that in the first example. In the second example illustrated in FIG. 9, the shift register 221a is coupled to the first power supply line VL1 and the sixth power supply line VL6 as power sources, outputs the sixth potential VGH from the sixth power supply line VL6 as the gate selection signal SRon, and outputs the first potential VGL from the first power supply line VL1 as the gate non-selection signal SRoff.

Each of the output circuits 222a includes the inversion buffer circuit RBuf, the first switch Tr5, and the second switch Tr6. The output end of the first switch Tr5 and the output end of the second switch Tr6 are both coupled to the scanning line SCL. The input end of the first switch Tr5 is coupled to the first wire L1, and the input end of the second switch Tr6 is coupled to the second wire L2. The first switch Tr5 and the second switch Tr6 are controlled to be on and off based on the output signals SRon and SRoff from the shift register 221a. More specifically, the output signals SRon and SRoff from the shift register 221a are supplied to the first switch Tr5 directly or through the inversion buffer circuit RBuf. The output signals SRon and SRoff from the shift register 221a are also supplied to the second switch Tr6 through the inversion buffer circuit RBuf.

The inversion buffer circuit RBuf inverts and outputs the output signals SRon and SRoff from the shift register 221a. More specifically, the inversion buffer circuit RBuf is coupled to the first power supply line VL1 and the sixth power supply line VL6 as power sources, and outputs the first potential VGL from the first power supply line VL1 when having received the gate selection signal SRon from the shift register 221a. Similarly, the inversion buffer circuit RBuf outputs the sixth potential VGH from the sixth power supply line VL6 when having received the gate non-selection signal SRoff from the shift register 221a.

The first switch Tr5 has, for example, a configuration in which a PMOS transistor is coupled in parallel with an NMOS transistor. The NMOS transistor is controlled to be on and off by the output signals SRon and SRoff from the shift register 221a. The inversion buffer circuit RBuf is provided between the PMOS transistor and the shift register 221a, and the PMOS transistor is controlled to be on and off by the output from the inversion buffer circuit RBuf. The NMOS transistor has a gate directly coupled to the output end of the shift register 221a and is controlled to be on and off by the output signals SRon and SRoff from the shift register 221a. The first switch Tr5 outputs, to the scanning line SCL, the gate drive signal ENB output from the drive signal generation circuit 23a as the PMOS transistor and the NMOS transistor are controlled to be on and off based on the output signals SRon and SRoff from the shift register 221a.

The second switch Tr6 is, for example, an NMOS transistor. The inversion buffer circuit RBuf is provided between the second switch Tr6 and the shift register 221a, and the second switch Tr6 is controlled to be on and off based on an output signal from the inversion buffer circuit RBuf. The second switch Tr6 outputs, through on/off-control based on the output from the inversion buffer circuit RBuf, the first potential VGL output from the second wire L2.

The switch circuit couples either one of the first wire L1 and the second wire L2 to the corresponding scanning line SCL based on the output signals SRon and SRoff from the shift register 221a. More specifically, the first switch Tr5 is provided between the first wire L1 and the scanning line SCL, and the second switch Tr6 is provided between the second wire L2 and the scanning line SCL. The first wire L1 and the second wire L2 are complementarily driven based on the output signals SRon and SRoff from the shift register 221a. Specifically, when the gate selection signal SRon is output from the shift register 221a, the first switch Tr5 is turned on and the second switch Tr6 is turned off. When the gate non-selection signal SRoff is output from the shift register 221a, the second switch Tr6 is turned on and the first switch Tr5 is turned off.

In this manner, the scanning signal GATE to be supplied to each of the scanning lines SCL is formed for the scanning line SCL by sequentially switching the gate drive signal ENB from the first wire L1 and the gate-off signal (first potential VGL) from the second wire L2 in a time divisional manner. More specifically, the gate drive signal ENB is supplied to a scanning line SCL for a predetermined period, and accordingly, the corresponding pixel transistors TRD are driven. For each period in which the gate drive signal ENB is not supplied, the gate-off signal (first potential VGL) is supplied to a scanning line SCL, and accordingly, the corresponding pixel transistors TRD are maintained in a non-driven state (gate-off state). The following describes operation in the configuration of the above-described second example of the embodiment.

As illustrated in FIG. 10, in the period of the gate selection signal SRon output from the shift register 221a, the output circuit 222a outputs the gate drive signal ENB output from the drive signal generation circuit 23a. Specifically, a scanning line SCL to which the gate drive signal ENB is to be supplied is selected by the gate selection signal SRon.

Figure 11A:
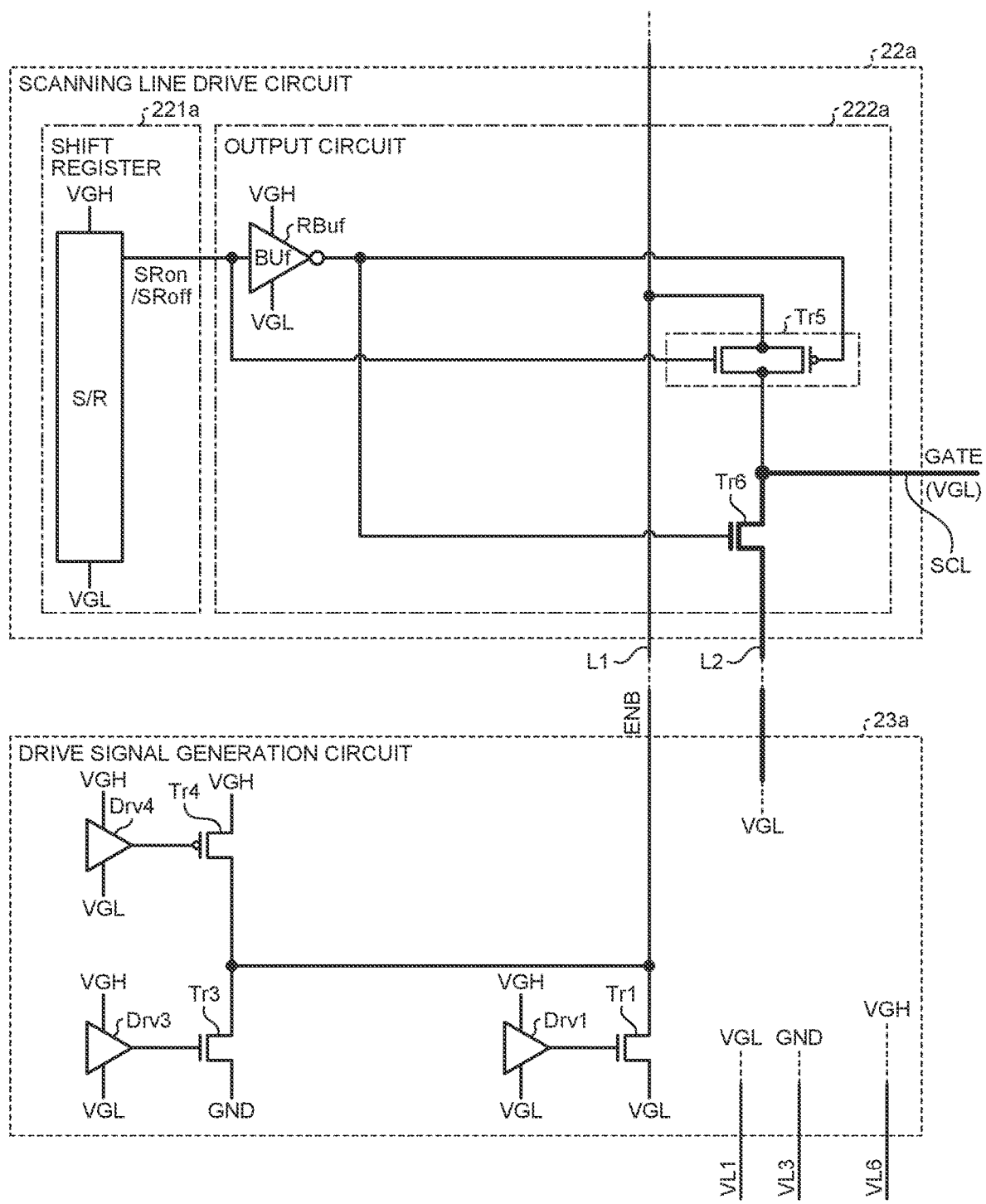
FIG. 11A is a diagram illustrating a gate drive signal path in period L illustrated in FIG. 10.

As illustrated in FIG. 11A, in the non-selection period of a scanning line SCL (period L illustrated in FIG. 10), the shift register 221a outputs the gate non-selection signal SRoff toward the corresponding output circuit 222a. When the gate non-selection signal SRoff is input from the shift register 221a to the output circuit 222a, the gate non-selection signal SRoff is directly supplied to the gate of the NMOS transistor of the first switch Tr5. The gate non-selection signal SRoff has the first potential VGL of the first power supply line VL1, and accordingly, the NMOS transistor is controlled to be off. The gate non-selection signal SRoff is also input to the inversion buffer circuit RBuf and output as the non-selection inversion signal. Then, the inversion buffer circuit RBuf outputs the sixth potential VGH toward the gate of the PMOS transistor. Accordingly, the PMOS transistor is controlled to be off. Simultaneously, the inversion buffer circuit RBuf outputs the sixth potential VGH toward the gate of the second switch Tr6. Accordingly, the second switch Tr6 is controlled to be on. As a result, the second wire L2 is coupled to the scanning line SCL, and the gate-off signal (first potential VGL) is supplied to the scanning line SCL. Accordingly, the pixel transistor TRD of each of the pixels PX coupled to the scanning line SCL is controlled to be off, and the signal line DTL and the pixel electrode Pix (pixel capacitor CS) thereof are uncoupled. Alternatively, the pixel electrode Pix is maintained in a floating state.

In the non-selection period of the scanning line SCL, the transistor Tr1 is controlled to be on and the transistors Tr3 and Tr4 are controlled to be off in the drive signal generation circuit 23. Accordingly, the first switch Tr5 of the output circuit 222a in the non-selection period is controlled to be off but supplied with potential equal to that of the second wire L2 (refer to FIG. 11A).

Subsequently, transition is made based on the clock signal to selection periods (H1 to H5) in which the scanning line SCL is selected.

Figure 11B:
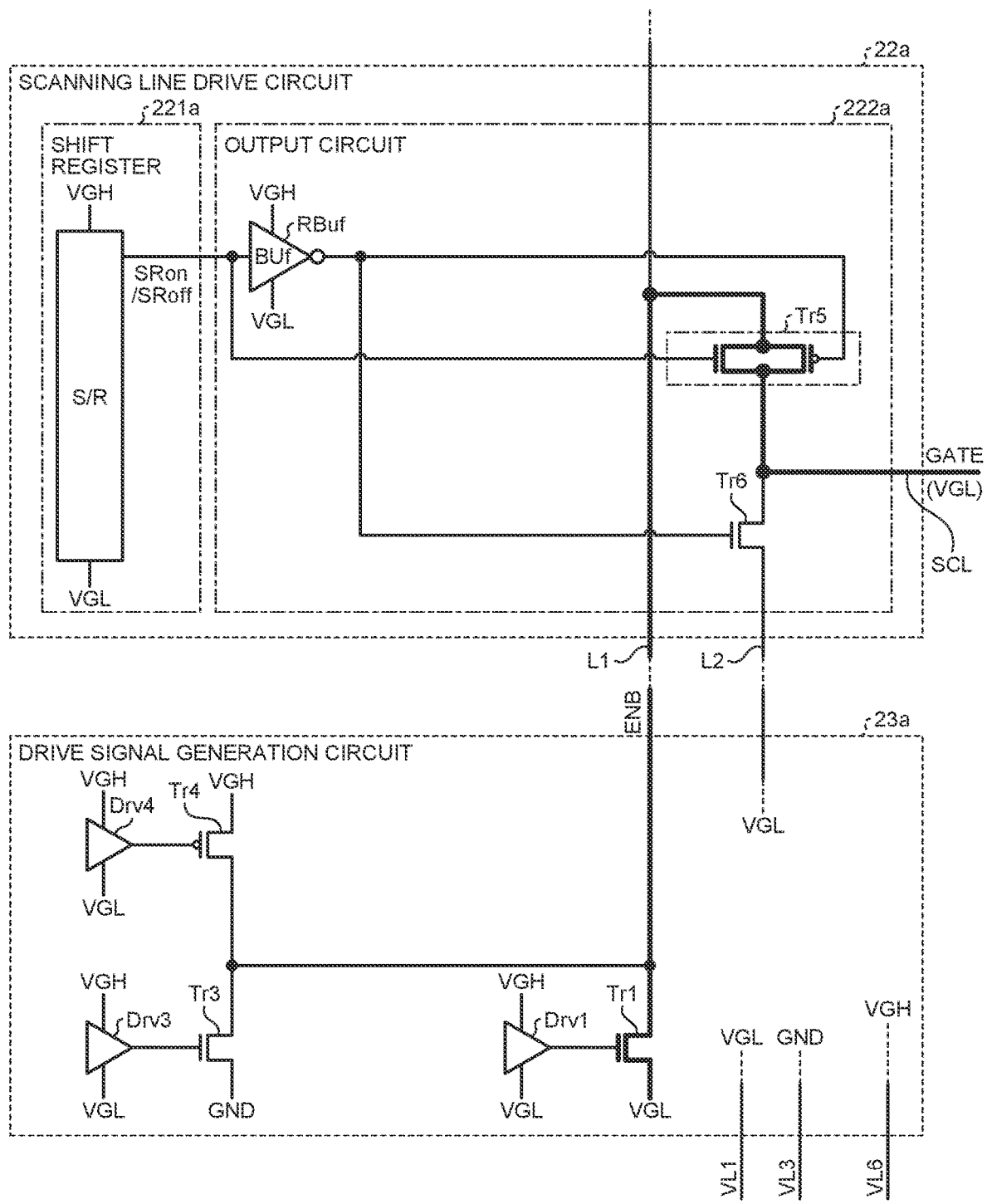
FIG. 11B is a diagram illustrating the gate drive signal path in periods H1 and H5 illustrated in FIG. 10.
Figure 11C:
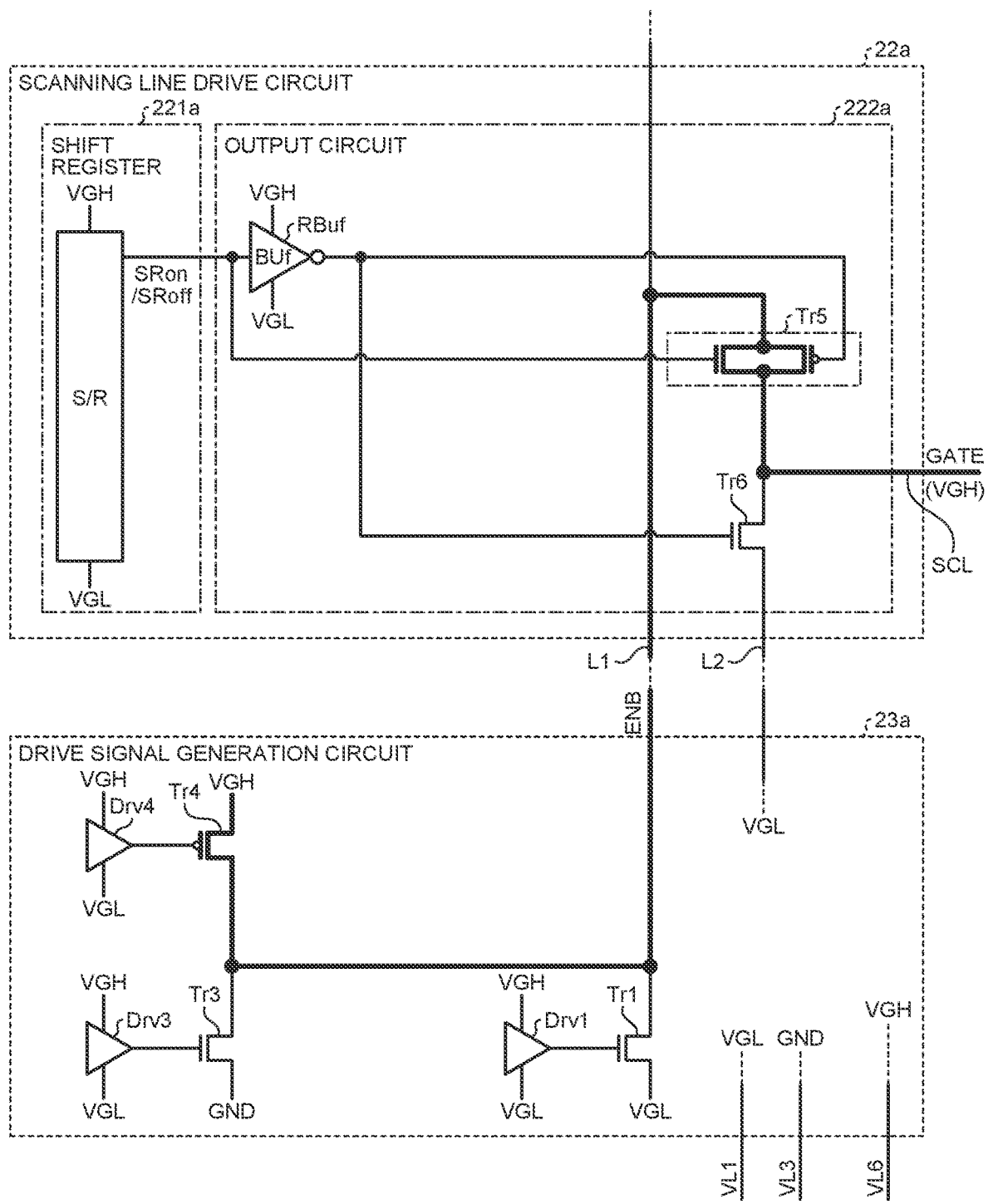
FIG. 11C is a diagram illustrating the gate drive signal path in period H2 illustrated in FIG. 10.
Figure 11D:
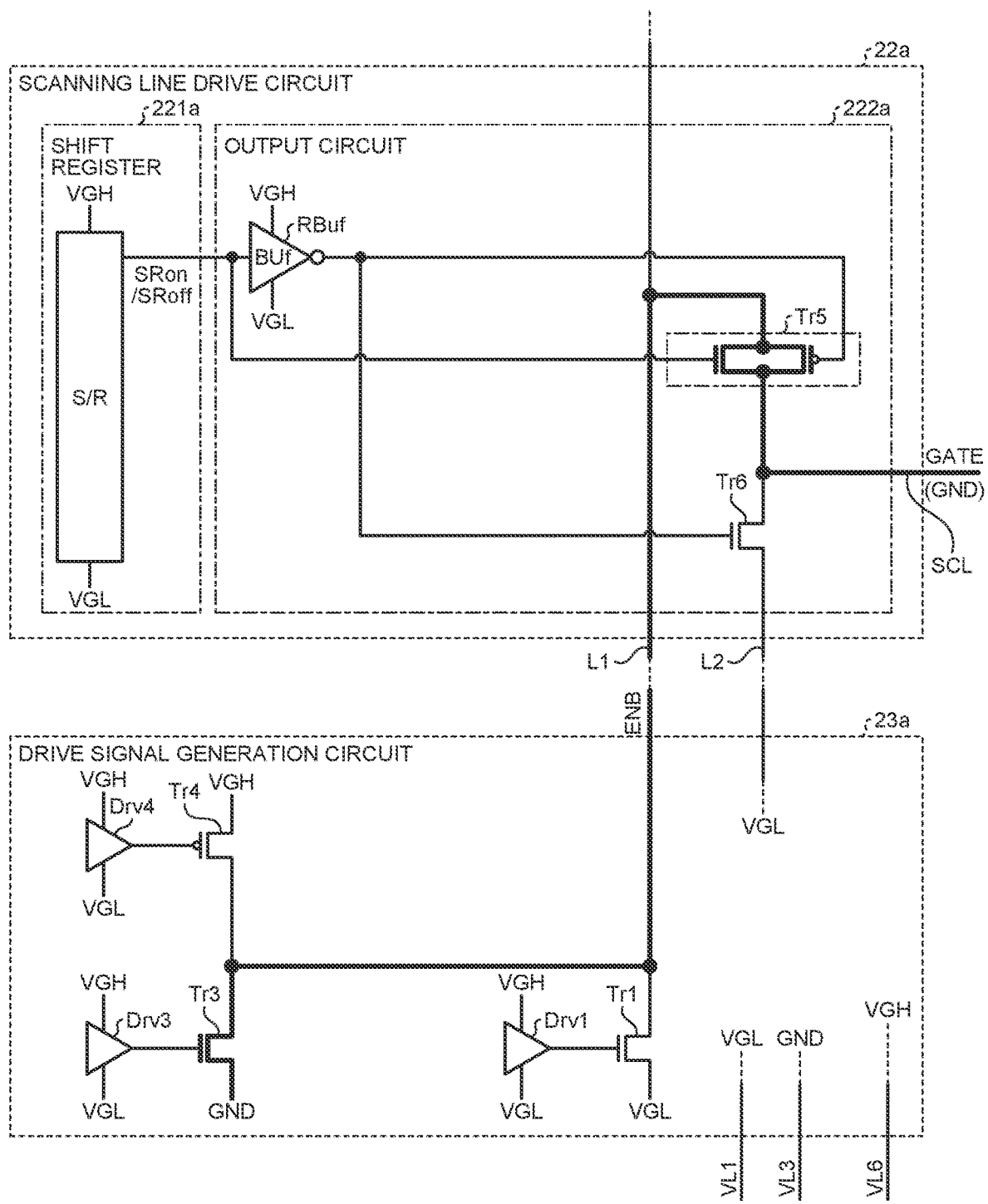
FIG. 11D is a diagram illustrating the gate drive signal path in period H3 illustrated in FIG. 10.

Specific drive of the scanning line drive circuit 22a and the drive signal generation circuit 23a in the period H1 illustrated in FIG. 10 is illustrated in FIG. 11B. In the period H1, the shift register 221a outputs the gate selection signal SRon toward the corresponding output circuit 222a. When the gate selection signal SRon is input from the shift register 221a to the output circuit 222a, the gate selection signal SRon is directly supplied to the gate of the NMOS transistor of the first switch Tr5, and accordingly, the NMOS transistor is controlled to be on. The gate selection signal SRon is also input to the inversion buffer circuit RBuf and output as a selection inversion signal. Then, the inversion buffer circuit RBuf outputs the first potential VGL toward the gate of the PMOS transistor. Accordingly, the PMOS transistor is controlled to be off (maintained in off-control). As a result, the first switch Tr5 as a whole is controlled to be on, and the scanning line SCL is coupled to the first wire L1. Simultaneously, the inversion buffer circuit RBuf outputs the first potential VGL toward the gate of the second switch Tr6. Accordingly, the second switch Tr6 is controlled to be off. As a result, the second wire L2 and the scanning line SCL are uncoupled.

Simultaneously in the drive signal generation circuit 23a, the transistor Tr1 is controlled to be on and the transistors Tr3 and Tr4 are controlled to be off based on the clock signal. Accordingly, the potential of the gate drive signal ENB becomes the first potential VGL and is supplied to the scanning line SCL through the first wire L1 and the first switch Tr5 of the output circuit 222 (refer to FIG. 11B).

In the period H2 illustrated in FIG. 10, the output from the shift register 221a is maintained as the gate selection signal SRon, and thus the state of the output circuit 222 is maintained as in period H1. Simultaneously in the drive signal generation circuit 23, the transistor Tr4 is controlled to be on and the transistors Tr1 and Tr3 are controlled to be off based on the clock signal. Accordingly, the potential of the gate drive signal ENB becomes the sixth potential VGH and is supplied to the scanning line SCL through the first switch Tr5 of the output circuit 222a (refer to FIG. 11C). Accordingly, the pixel transistor TRD of each of the pixels PX coupled to the scanning line SCL is controlled to be on. At this timing, the pixel signal SIG for each of the pixels PX is input to the corresponding signal line DTL and then input to the pixel capacitor CS through the pixel transistor TRD controlled to be on.

In the period H3 illustrated in FIG. 10, the output from the shift register 221a is maintained as the gate selection signal SRon, and thus the state of the output circuit 222a is maintained as in the period H1. Simultaneously in the drive signal generation circuit 23a, the transistor Tr3 is controlled to be on and the transistors Tr1 and Tr4 are controlled to be off based on the clock signal. Accordingly, the potential of the gate drive signal ENB becomes the third potential GND and is supplied to the first wire L1. Then, the potential of the first wire L1 decreases from the sixth potential VGH to the third potential GND. This potential is higher than the gate potential of the PMOS transistor of the first switch Tr5 and lower than the gate potential of the NMOS transistor thereof. Accordingly, the NMOS transistor is maintained in on-control and the PMOS transistor is changed into on-control from off-control. The first switch Tr5 as a whole is maintained in on-control and the second switch Tr6 is maintained in off-control. Thus, the first wire L1 is coupled to the scanning line SCL through the first switch Tr5, and the gate drive signal ENB at the third potential GND is input to the scanning line SCL (refer to FIG. 11D).

In the period H5 illustrated in FIG. 10, the output from the shift register 221a is maintained as the gate selection signal SRon, and thus the state of the output circuit 222a is maintained as in the period H1. Simultaneously in the drive signal generation circuit 23a, the transistor Tr1 is controlled to be on again and the transistors Tr3 and Tr4 are controlled to be off based on the clock signal. Accordingly, the potential of the gate drive signal ENB becomes the first potential VGL and is output to the first wire L1. Then, the potential of the first wire L1 decreases from the third potential GND to the first potential VGL. This potential is equal to the gate potential of the PMOS transistor of the first switch Tr5 and lower than the gate potential of the NMOS transistor thereof. Accordingly, the NMOS transistor is maintained in on-control and the PMOS transistor is also maintained in on-control. The first switch Tr5 as a whole is maintained in on-control and the second switch Tr6 is maintained in off-control. Thus, the first wire L1 is coupled to the scanning line SCL through the first switch Tr5, and the gate drive signal ENB of the first potential VGL is input to the scanning line SCL. The first potential VGL is what is called a gate-off potential, and accordingly, the off-state of the pixel transistor TRD of each of the pixels PX is maintained (refer to FIG. 11A).

Thereafter, the selection period of the scanning line SCL at the current stage ends. Specifically, the shift register 221a outputs the gate non-selection signal SRoff toward the corresponding output circuit 222a. As a result, the output circuit 222a becomes the drive state illustrated in FIG. 8A, and accordingly, the first switch Tr5 is controlled to be off and the second switch Tr6 is controlled to be on. As a result, the second wire L2 is coupled to the scanning line SCL, and the gate-off potential (first potential VGL) is supplied to the scanning line SCL. Accordingly, the pixel transistor TRD of each of the pixels PX coupled to the scanning line SCL is maintained in off-control.

Since the selection period at the current stage ends, transition is made to the selection period at the next stage. In the next horizontal period, the above-described drive in H1 to H5 is performed for the output circuit 222a at the next stage, which is selected by the shift register 221a, and the corresponding scanning line SCL. In this manner, the output circuit 222a is maintained in a state in the non-selection period until the next selection period, but the drive signal generation circuit 23a repeats the above-described drive in FIGS. 11B to 11D for each horizontal period. Accordingly, the gate drive signal ENB is supplied to the scanning line SCL at each stage.

Figure 12:
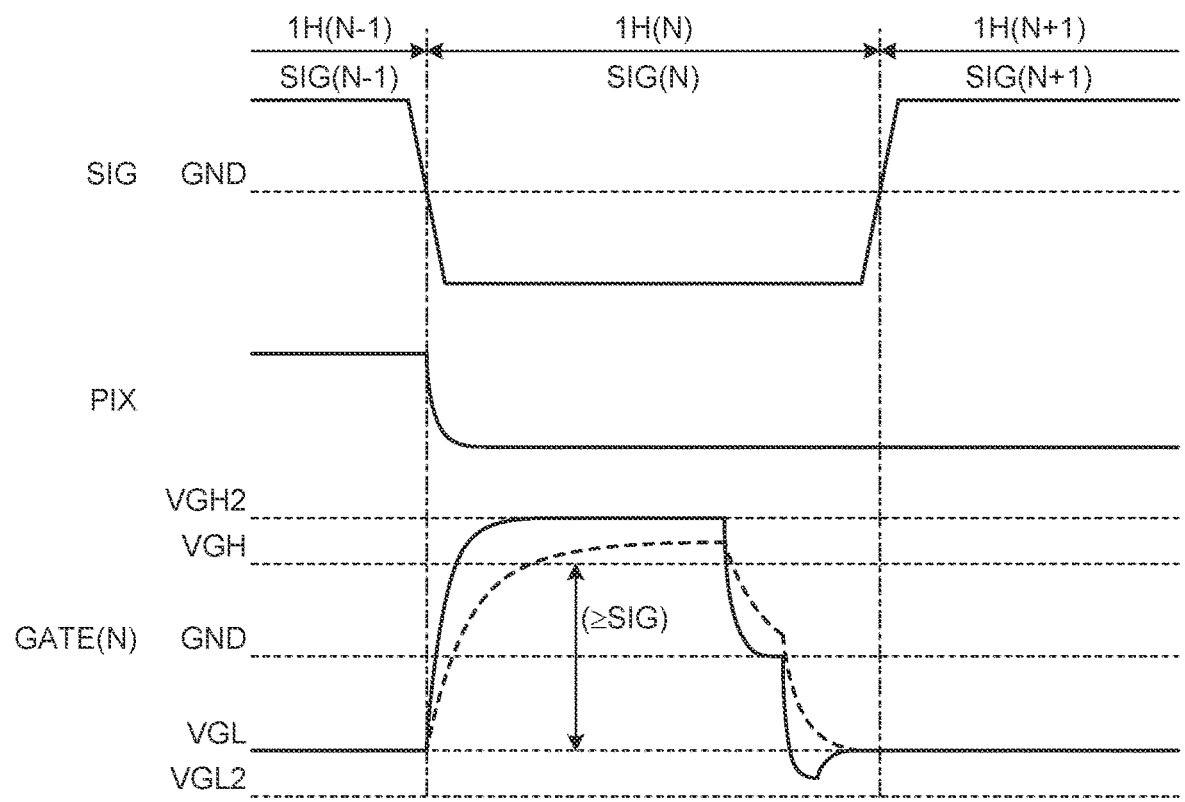
FIG. 12 is a diagram illustrating exemplary waveforms of components such as a pixel signal, a pixel electrode, and a scanning signal in the display device according to the embodiment.
Figure 13:
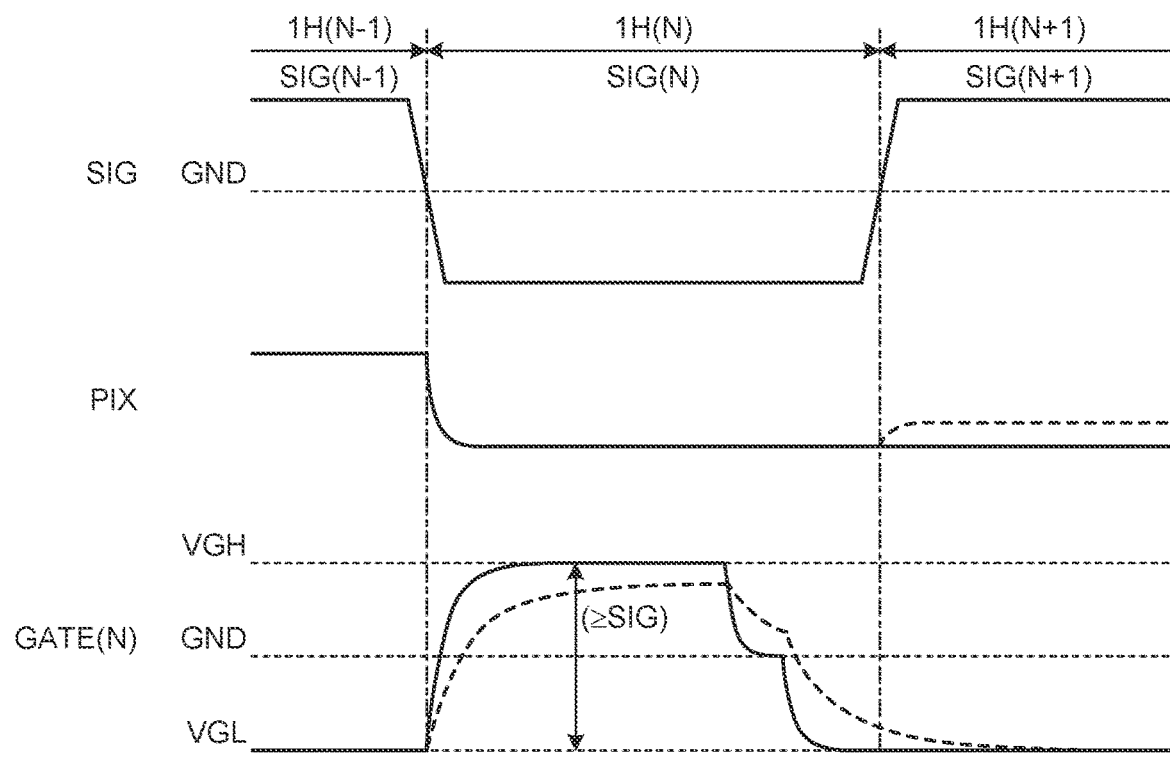
FIG. 13 is a diagram illustrating exemplary waveforms of components such as the pixel signal, the pixel electrode, and the scanning signal in a display device according to the second example of the embodiment.

FIG. 12 is a diagram illustrating exemplary waveforms of components such as the pixel signal, the pixel electrode, and the scanning signal in the display device according to the embodiment. FIG. 13 is a diagram illustrating exemplary waveforms of components such as the pixel signal, the pixel electrode, and the pixel signal in the display device according to the second example of the embodiment. In the examples illustrated in FIGS. 12 and 13, solid lines represent waveforms of components in the vicinity of the scanning line drive circuits 22 and 22a (the vicinity of a right end part of the display region in FIG. 1), and dashed lines represent waveforms of components at a position away from the scanning line drive circuits 22 and 22a (in the vicinity of a left end part of the display region in FIG. 1). In FIGS. 12 and 13, 1H(N) period is one horizontal period in which a gate drive signal GATE(N) is supplied, 1H(N−1) period is one horizontal period before the gate drive signal GATE(N) is supplied, and 1H(N+1) period is one horizontal period after the gate drive signal GATE(N) is supplied.

In the display device 10 according to the present embodiment, the potential of the gate drive signal ENB is the fourth potential VGH2 in the period H2 illustrated in FIG. 7 as described above. Thus, as illustrated in FIG. 12, a start period of a period in which the pixel transistor TRD is controlled to be on can be accelerated within one horizontal period for the scanning signal waveform (dashed line illustrated in FIG. 12) in the vicinity of the scanning line drive circuit 22 as well as at the position away from the scanning line drive circuit 22.

In the display device 10 according to the present embodiment, as described above, the potential of the gate drive signal ENB is set to be the second potential VGL2 in the period H4 illustrated in FIG. 7 so that the second potential VGL2 is supplied to the scanning line SCL. Thus, as illustrated in FIG. 12, a period in which the pixel transistor TRD is controlled to be off can be provided within one horizontal period for the scanning signal waveform (dashed line illustrated in FIG. 12) in the vicinity of the scanning line drive circuit 22 as well as at the position away from the scanning line drive circuit 22. Accordingly, it is possible to shorten a selection period of a gate bus line (scanning line) SCL, thereby achieving high-speed drawing.

In period H5 illustrated in FIG. 7, the potential of the gate drive signal ENB is set to be the first potential VGL. Accordingly, it is possible to shorten a period in which the potential of the gate drive signal ENB is increased to VGH2 again in the next horizontal period, and thus an on-control period in one horizontal period can be secured certainly.

In the second example of the embodiment, the potential of the gate drive signal ENB is set to be the sixth potential VGH in the period H1 illustrated in FIG. 10. Thus, as illustrated in FIG. 13, start of a period in which the sixth potential VGH is maintained is delayed in one horizontal period for the scanning signal waveform (dashed line illustrated in FIG. 13) at the position away from the scanning line drive circuit 22a because the scanning line SCL passes among a large number of the pixels PX and on a large number of the signal lines DTL, which leads to large parasitic capacitance.

In the second example of the embodiment, the potential of the gate drive signal ENB is set to be the first potential VGL in the period H5 illustrated in FIG. 10. However, in the scanning signal waveform (dashed line illustrated in FIG. 13) at the position away from the scanning line drive circuit 22a, the potential of the scanning line SCL may not become the first potential VGL within one horizontal period due to the above-described parasitic capacitance. As a result, the pixel transistor TRD cannot be completely controlled to be off in this separated region, and the pixel signal SIG to be input to a pixel PX at the next stage may be input. Alternatively, to avoid such failure, the period H5 after the charging period of the pixel capacitor CS is required to become longer.

As described above, in the second example of the embodiment, a charging period of the pixel capacitor CS or the period H5 after the charging period of the pixel capacitor CS is required to become longer. Thus, in the second example of the embodiment, the selection period of the scanning line SCL is required to become longer, but accordingly, a time for displaying one frame is required to become longer, and high-speed drawing is difficult to be realized.

The potential of the fourth potential VGH2 is supplied from the second potential VGL2 to the source of the first switch Tr5 in the present embodiment, and accordingly, potential variation is large. Thus, potential corresponding to the potential variation needs to be supplied to the gate of the transistor Tr1, which increases power of the shift register and accordingly increases electric power consumption as a whole. However, in the present embodiment, the first level shifter LS1 is provided between the first switch Tr5 and the shift register 221 so that the output from the shift register is supplied to the first switch Tr5 after changing its level at the first level shifter LS1. Accordingly, appropriate potential can be supplied only to a part that needs large gate potential, which leads to reduction of electric power consumption of the entire display control circuit 20.

Modification

A display device having an incorporated capacitive touch detection function will be described below as a modification. Any component same as that in the embodiment is denoted by the same reference sign and description thereof is omitted.

Figure 14:
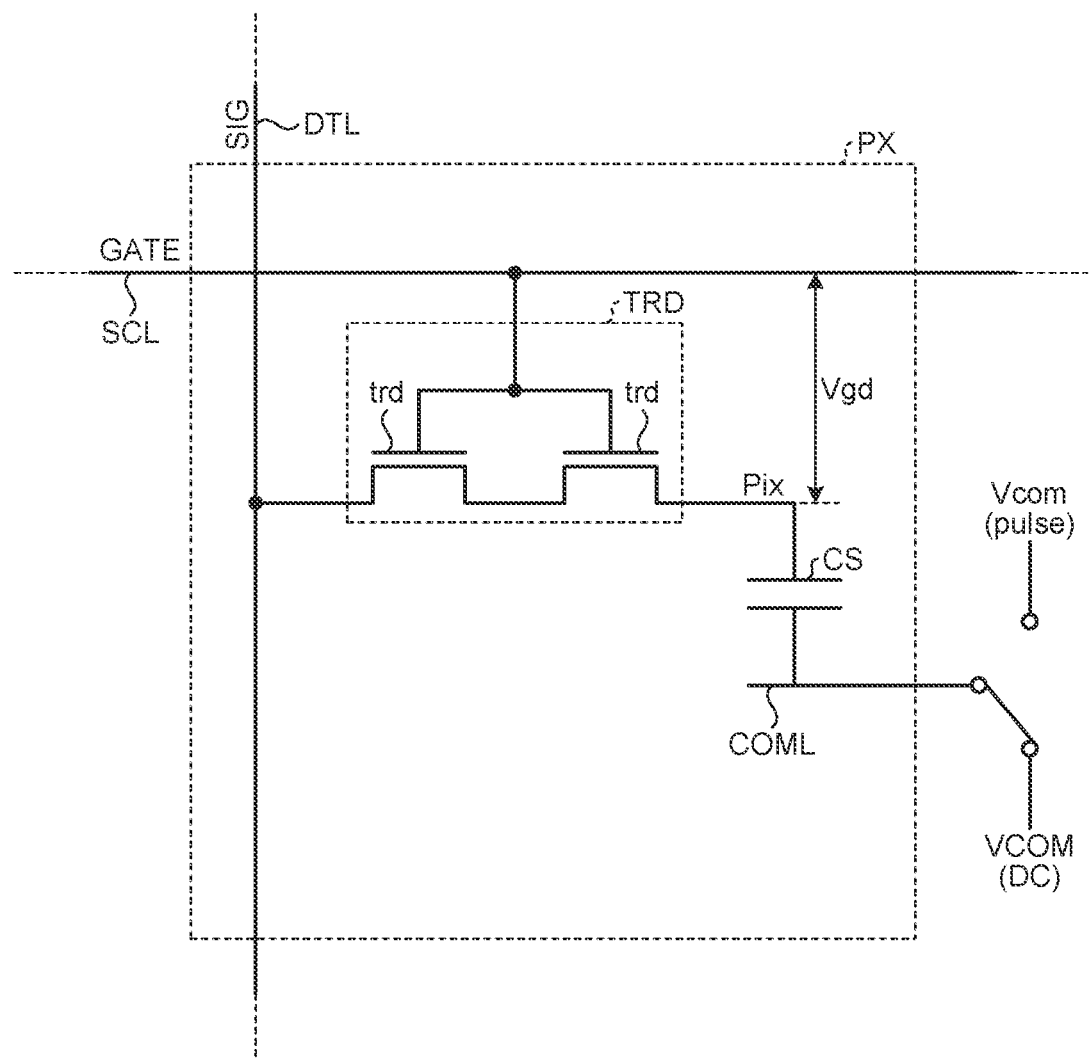
FIG. 14 is a diagram illustrating an example of the configuration of a pixel in a display device according to a modification.
Figure 15:
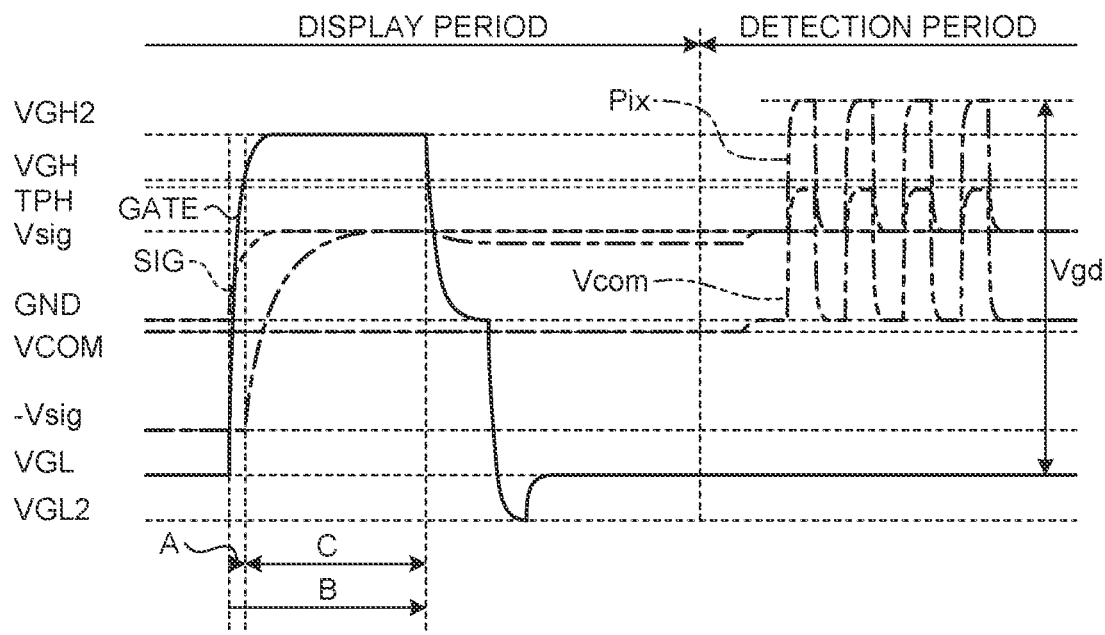
FIG. 15 is a diagram illustrating exemplary waveforms of components in a configuration according to the modification.
Figure 16:
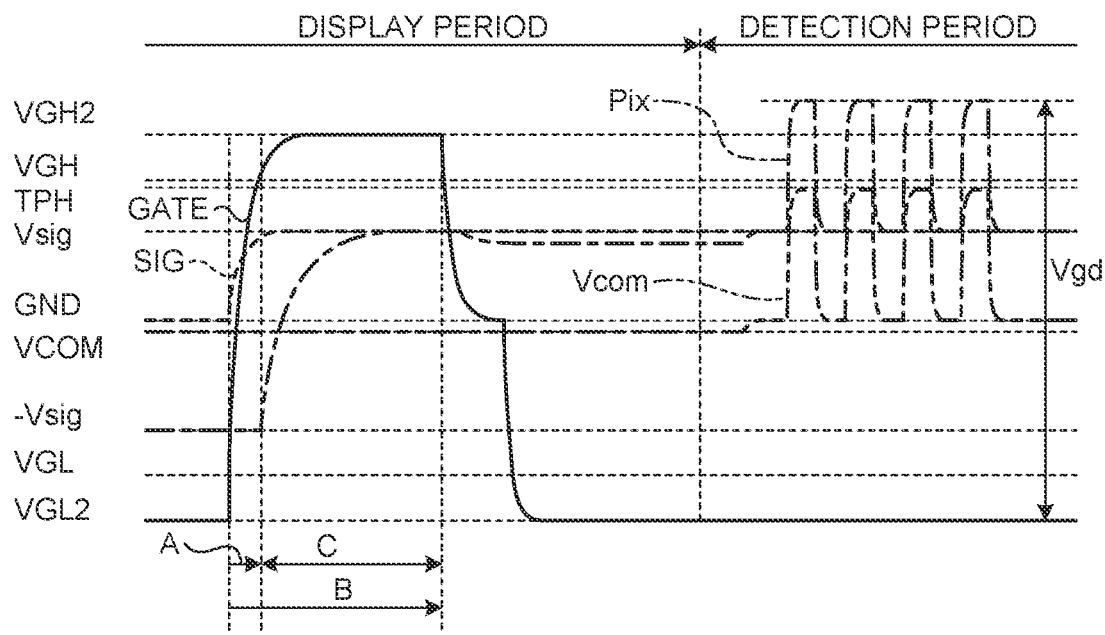
FIG. 16 is a diagram illustrating exemplary waveforms of components in a comparative example.

FIG. 14 is a diagram illustrating an example of a configuration of a pixel in the display device according to the modification. FIG. 15 is a diagram illustrating exemplary waveforms of components in the configuration according to the modification. FIG. 16 is a diagram illustrating exemplary waveforms of components in a comparative example.

In the present embodiment, the display device having a touch detection function corresponds to what is called an in-cell or hybrid device incorporating and integrating with a capacitive touch sensor configured to detect a detection target body, such as a finger of an operator who is in contact with or close to the display region 11.

The display device according to the present modification has a detection period right after a display period made of a predetermined number of horizontal periods. As illustrated in FIG. 15, the common potential VCOM is supplied to the common electrode COML in the display period, and a touch drive signal Vcom is supplied as a touch detection drive signal in the detection period. The touch drive signal Vcom forms a capacitance between the common electrode COML and another electrode (touch detection electrode), and this capacitance varies as a finger of an operator comes close thereto. A touch to the display is detected by detecting the variation. Alternatively, the touch drive signal Vcom is input to the common electrode COML, and the common electrode COML forms a capacitance between the common electrode COML and a finger of an operator. A touch is detected by detecting the variation of this capacitance through the common electrode COML. This is another possible scheme. In the present embodiment, the common potential VCOM is fixed potential (DC), and the touch drive signal Vcom is a pulsed wave (pulse). The common potential VCOM is slightly lower than the third potential GND, and the touch drive signal Vcom is a pulsed wave that varies from the common potential VCOM to potential TPH slightly lower than the sixth potential VGH. Alternatively, for example, the common potential VCOM may be an alternating-current signal, and the touch drive signal Vcom may be a drive signal other than a pulsed wave.

In the present modification, as illustrated in FIG. 15, a period A until the scanning signal GATE becomes equal to or higher than the sixth potential VGH can be shortened as compared to that in the comparative example illustrated in FIG. 16. Thus, a period B as a sum of the period A and a charging period C of the pixel capacitor CS until the scanning signal GATE becomes equal to or lower than the sixth potential VGH can be shortened as compared to that in the comparative example illustrated in FIG. 16. Accordingly, a selection period of the scanning line SCL can be shortened as compared to that in the comparative example illustrated in FIG. 16, and a gate drive of the pixel transistor TRD can be accelerated.

In the display device having a touch detection function, the drive signal Vcom for touch detection is supplied to the common electrode COML in the detection period, and thus the potential of the pixel electrode Pix varies with the variation of the common electrode COML. In this case, since the pixel transistor TRD is controlled to be off, the pixel electrode Pix is in a floating state as seen from the pixel transistor TRD, and the potential of the pixel electrode Pix is equal to the potential of the drain of the pixel transistor TRD. The potential difference between the gate and drain of the pixel transistor TRD is denoted by Vgd. Specifically, Vgd varies by supplying the drive signal Vcom as a pulse signal to the common electrode.

In the present modification, similarly to the above-described embodiment, the potential of the scanning line SCL in the non-selection period of the scanning line SCL is set to the first potential VGL, and not set to the second potential VGL2.

In the present modification, the detection period is a part of the non-selection period of the scanning line SCL. Specifically, the potential of the scanning line SCL in the detection period is the first potential VGL which is same as that in the non-selection period of the scanning line SCL. Accordingly, the potential difference Vgd between the gate and drain of the pixel transistor TRD becomes lower than that in the comparative example illustrated in FIG. 15. Thus, a reliability risk of the pixel transistor TRD can be reduced.

Since the detection period is a part of the non-selection period as described above, the shift register 221 and the output circuit 222 are maintained in the state in FIG. 8A. In this state, the second switch Tr6 is controlled to be on, and thus the first potential VGL is supplied from the second wire L2 to the scanning line SCL, whereas the sixth potential VGH higher than the output potential (the fifth potential VDD) of the shift register 221 is supplied to the gate of the second switch Tr6 through the second level shifter LS2.

As described above, in the detection period, the potential of the common electrode COML varies greatly in a range from the potential VCOM to TPH, and the gate potential of the second switch Tr6 may follow the variation. However, in the present embodiment, the gate potential is set to be the sixth potential VGH higher than the output potential (fifth potential VDD) from the shift register 221 through the second level shifter LS2. The sixth potential VGH is higher than the maximum potential TPH of the touch drive signal Vcom input to the common electrode COML, and accordingly, influence of the potential variation is suppressed as much as possible.

As described above, a display device 10 includes a display region 11 in which multiple pixels PX each of which includes a pixel capacitor CS and a pixel transistor TRD are arranged in a matrix of a row-column configuration in a first direction (X direction) and a second direction (Y direction) intersecting the first direction (X direction); multiple scanning lines SCL electrically coupled to the multiple pixels PX arranged in the first direction (X direction); multiple signal lines DTL electrically coupled to the multiple pixels PX arranged in the second direction (Y direction); and a display control circuit 20 provided in a non-display region 12 enclosing the display region 11 and configured to control the pixel transistor TRD to be on and off through the scanning lines SCL. The pixel transistor TRD is an N-type transistor, has a gate coupled to the scanning line SCL, has a source coupled to the signal line SIG, and has a drain coupled to the pixel capacitor CS. The display control circuit 20 includes a drive signal generation circuit 23 configured to generate a gate drive signal ENB that controls the pixel transistor TRD to be on and off, a scanning line drive circuit 22 configured to supply the gate drive signal ENB to each of the multiple scanning lines SCL, and a first wire L1 through which the gate drive signal ENB from the drive signal generation circuit 23 is supplied to the scanning line drive circuit 22. The drive signal generation circuit 23 includes a first potential supply circuit (the transistor Tr1 and the drive circuit Drv1) configured to supply, to the first wire L1, a first potential VGL equal to or lower than an off-potential of the pixel transistor TRD, a second potential supply circuit (the transistor Tr2 and the drive circuit Drv2) configured to supply, to the first wire L1, a second potential VGL2 lower than the first potential VGL, a third potential supply circuit (the transistor Tr3 and the drive circuit Drv3) configured to supply, to the first wire L1, a third potential (GND) higher than the first potential VGL, and a fourth potential supply circuit (the transistor Tr4 and the drive circuit Drv4) configured to supply, to the first wire L1, a fourth potential VGH2 higher than the third potential (GND) and equal to or higher than an on-potential of the pixel transistor TRD.

With the above-described configuration, the selection period of the scanning line SCL can be shortened, and the gate drive of the pixel transistors TRD can be accelerated.

According to the present embodiment, it is possible to provide the display device 10 that can accelerate the gate drive of the pixel transistors TRD.

In the above-described embodiment, as for the first potential VGL, the second potential VGL2, the fourth potential VGH2, the fifth potential VDD (VDD1), VDD2, and the sixth potential VGH, any positive-polarity voltage supplied from the external power source 200 may be stepped up or down to generate other positive-polarity voltages, or any negative-polarity voltage supplied from the external power source 200 may be stepped up or down to generate other negative-polarity voltages.

Alternatively, all power voltages may be generated and supplied by the external power source 200. The present disclosure is not limited by these configurations of generating or supplying the power voltages.

The components of above-described embodiments may be combined as appropriate. It is understood that the embodiments provide other effects of aspects described in the embodiments, which are clear from description in the present specification or could be thought of by the skilled person in the art as appropriate.

What is claimed is:

1. A display device comprising:
a display region in which multiple pixels each of which includes a pixel capacitor and a pixel transistor are arranged in a matrix of a row-column configuration in a first direction and a second direction intersecting the first direction;
multiple scanning lines electrically coupled to the multiple pixels arranged in the first direction;
multiple signal lines electrically coupled to the multiple pixels arranged in the second direction; and
a display control circuit provided in a non-display region enclosing the display region and configured to control the pixel transistor to be on and off through the multiple scanning lines, wherein
the pixel transistor is an N-type transistor, having a gate coupled to a scanning line, having a source coupled to a signal line, and having a drain coupled to the pixel capacitor,
the display control circuit includes
a drive signal generation circuit configured to generate a gate drive signal that controls the pixel transistor to be on and off,
a scanning line drive circuit configured to supply the gate drive signal to the scanning line, and
a first wire through which the gate drive signal from the drive signal generation circuit is supplied to the scanning line drive circuit, and
the drive signal generation circuit includes
a first potential supply circuit configured to supply, to the first wire, a first potential equal to or lower than an off-potential of the pixel transistor,
a second potential supply circuit configured to supply, to the first wire, a second potential lower than the first potential,
a third potential supply circuit configured to supply, to the first wire, a third potential higher than the first potential, and
a fourth potential supply circuit configured to supply, to the first wire, a fourth potential higher than the third potential and equal to or higher than an on-potential of the pixel transistor,
the scanning line drive circuit is supplied through the first wire with the gate drive signal having a potential changing to be the first potential, the second potential, the third potential, and the fourth potential, by sequentially controlling the first potential supply circuit, the second potential supply circuit, the third potential supply circuit, and the fourth potential supply circuit to be on and off,
the display control circuit includes a second wire through which a gate-off signal that maintains the gate of the pixel transistor in an off-state is supplied to the scanning line drive circuit,
the scanning line drive circuit includes an output circuit which is coupled to each of the multiple scanning lines and a shift register configured to supply an output signal to the output circuit,
the output circuit includes a switch circuit configured to couple the first wire or the second wire to each of the multiple scanning lines based on the output signal from the shift register,
the switch circuit includes a first switch and a second switch, the first switch being provided between the first wire and each of the multiple scanning lines, the second switch being provided between the second wire and each of the multiple scanning lines,
the first switch is turned on and the second switch is turned off when the output from the shift register is high, and
the first switch is turned off and the second switch is turned on when the output from the shift register is low.

2. The display device according to claim 1, wherein the third potential is a ground potential.

3. The display device according to claim 1, wherein each of the multiple signal lines supplies a pixel signal to each of the multiple pixels, and the fourth potential is higher than a fifth potential that is a voltage upper limit value of the pixel signal.

4. The display device according to claim 1, wherein a potential difference between the first potential and the fourth potential is set to be equal to or lower than a breakdown potential of the pixel transistor.

5. The display device according to claim 1, wherein a potential difference between the second potential and the fourth potential is set to be equal to or higher than a breakdown potential of the pixel transistor.

6. The display device according to claim 1, wherein the output circuit includes, between the shift register and the first switch, a first level shifter configured to change a potential difference in an output from the shift register.

7. The display device according to claim 6, wherein the first switch is a Complementary Metal Oxide Semiconductor (CMOS) circuit including at least an N-type transistor and a P-type transistor, and the first level shifter is provided between the shift register and the P-type transistor of the first switch.

8. The display device according to claim 7, wherein a positive output of the first level shifter is the fourth potential, and a negative output of the first level shifter is the first potential.

9. The display device according to claim 1, wherein the output circuit includes, between the shift register and the second switch, a second level shifter configured to change a potential difference in an output from the shift register.

10. The display device according to claim 9, wherein the second switch is made of an N-type transistor, and the second level shifter is provided between the shift register and the N-type transistor of the second switch.

11. The display device according to claim 10, wherein a negative output of the second level shifter is the second potential.

12. The display device according to claim 1, wherein
a terminal unit for supplying power from an external power source to the display control circuit is provided in the non-display region, and
the terminal unit includes
a first potential terminal for supplying the first potential,
a second potential terminal for supplying the second potential,
a third potential terminal for supplying the third potential, and
a fourth potential terminal for supplying the fourth potential.

13. The display device according to claim 12, wherein
each of the multiple signal lines supplies a pixel signal to each of the multiple pixels,
the fourth potential is higher than a fifth potential that is a voltage upper limit value of the pixel signal, and
the terminal unit also includes a fifth potential terminal for supplying the fifth potential.

14. A semiconductor device comprising:
an effective region in which multiple units each of which includes a capacitor element and a transistor coupled the capacitor element are arranged in a first direction and a second direction intersecting the first direction;
multiple scanning lines electrically coupled to the multiple units arranged in the first direction;
multiple signal lines electrically coupled to the multiple units arranged in the second direction; and
a control circuit provided in a surrounding region enclosing the effective region and configured to control the transistor to be on and off through the multiple scanning lines, wherein
the transistor is an N-type transistor, having a gate coupled to a scanning line, having a source coupled to a signal line, and having a drain coupled to the capacitor element,
the control circuit includes
a drive signal generation circuit configured to generate a gate drive signal that controls the transistor to be on and off,
a scanning line drive circuit configured to supply the gate drive signal to the scanning line, and
a first wire through which the gate drive signal from the drive signal generation circuit is supplied to the scanning line drive circuit, and
the drive signal generation circuit includes
a first potential supply circuit configured to supply, to the first wire, a first potential equal to or lower than an off-potential of the transistor,
a second potential supply circuit configured to supply, to the first wire, a second potential lower than the first potential,
a third potential supply circuit configured to supply, to the first wire, a third potential higher than the first potential, and
a fourth potential supply circuit configured to supply, to the first wire, a fourth potential higher than the third potential and equal to or higher than an on-potential of the transistor,
the scanning line drive circuit is supplied through the first wire with the gate drive signal having a potential changing to be the first potential, the second potential, the third potential, and the fourth potential, by sequentially controlling the first potential supply circuit, the second potential supply circuit, the third potential supply circuit, and the fourth potential supply circuit to be on and off,
the control circuit includes a second wire through which a gate-off signal that maintains the gate of the transistor in an off-state is supplied to the scanning line drive circuit,
the scanning line drive circuit includes an output circuit which is coupled to each of the multiple scanning lines and a shift register configured to supply an output signal to the output circuit,
the output circuit includes a switch circuit configured to couple the first wire or the second wire to each of the multiple scanning lines based on the output signal from the shift register,
the switch circuit includes a first switch and a second switch, the first switch being provided between the first wire and each of the multiple scanning lines, the second switch being provided between the second wire and each of the multiple scanning lines,
the first switch is turned on and the second switch is turned off when the output from the shift register is high, and
the first switch is turned off and the second switch is turned on when the output from the shift register is low.

15. The semiconductor device according to claim 14, wherein the output circuit includes, between the shift register and the first switch, a first level shifter configured to change a potential difference in an output from the shift register.

16. The semiconductor device according to claim 14, wherein the output circuit includes, between the shift register and the second switch, a second level shifter configured to change a potential difference in an output from the shift register.

\* \* \* \* \*